(12) United States Patent
Sasagawa et al.

(10) Patent No.: US 7,534,640 B2
(45) Date of Patent: May 19, 2009

(54) SUPPORT STRUCTURE FOR MEMS DEVICE AND METHODS THEREFOR

(75) Inventors: Teruo Sasagawa, Los Gatos, CA (US); Clarence Chui, San Mateo, CA (US); Manish Kothari, Cupertino, CA (US); SuryaPrakash Ganti, Los Altos, CA (US); Jeffrey B. Sampsell, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 473 days.

(21) Appl. No.: 11/491,047

(22) Filed: Jul. 21, 2006

(65) Prior Publication Data

US 2007/0019922 A1 Jan. 25, 2007

Related U.S. Application Data

(60) Provisional application No. 60/710,019, filed on Aug. 19, 2005, provisional application No. 60/702,080, filed on Jul. 22, 2005.

(51) Int. Cl.
*H01L 21/00* (2006.01)
*H01L 29/82* (2006.01)

(52) U.S. Cl. ............................. 438/50; 438/52; 257/254; 257/415

(58) Field of Classification Search ............ 438/50–53; 257/252, 254, 415, 417
See application file for complete search history.

(56) References Cited

U.S. PATENT DOCUMENTS

| | | | |
|---|---|---|---|
| 2,534,846 A | 12/1950 | Ambrose et al. |
| 3,439,973 A | 4/1969 | Paul et al. |
| 3,443,854 A | 5/1969 | Weiss |
| 3,616,312 A | 10/1971 | McGriff et al. |
| 3,653,741 A | 4/1972 | Marks |
| 3,656,836 A | 4/1972 | de Cremoux et al. |
| 3,725,868 A | 4/1973 | Malmer, Jr. et al. |
| 3,813,265 A | 5/1974 | Marks |
| 3,955,880 A | 5/1976 | Lierke |
| 4,099,854 A | 7/1978 | Decker et al. |
| 4,196,396 A | 4/1980 | Smith |

(Continued)

FOREIGN PATENT DOCUMENTS

CH 681 047 12/1992

(Continued)

OTHER PUBLICATIONS

Dai Et Al., "A CMOS surface micromachined pressure sensor," Journal of the Chinese institute of Engineers, 1999, vol. 22, No. 3 (May), pp. 375-380.

(Continued)

*Primary Examiner*—Kevin M Picardat
(74) *Attorney, Agent, or Firm*—Knobbe Martens Olson & Bear LLP

(57) ABSTRACT

A microelectromechanical systems device having support structures formed of sacrificial material that is selectively diffused with a dopant material or formed of a selectively oxidized metal sacrificial material. The microelectromechanical systems device includes a substrate having an electrode formed thereon. Another electrode is separated from the first electrode by a cavity and forms a movable layer, which is supported by support structures formed of a diffused or oxidized sacrificial material.

55 Claims, 10 Drawing Sheets

U.S. PATENT DOCUMENTS

| | | | |
|---|---|---|---|
| 4,228,437 A | 10/1980 | Shelton | |
| 4,377,324 A | 3/1983 | Durand et al. | |
| 4,389,096 A | 6/1983 | Hori et al. | |
| 4,392,711 A | 7/1983 | Moraw et al. | |
| 4,403,248 A | 9/1983 | te Velde | |
| 4,441,791 A | 4/1984 | Hornbeck | |
| 4,445,050 A | 4/1984 | Marks | |
| 4,459,182 A | 7/1984 | te Velde | |
| 4,482,213 A | 11/1984 | Piliavin et al. | |
| 4,500,171 A | 2/1985 | Penz et al. | |
| 4,519,676 A | 5/1985 | te Velde | |
| 4,531,126 A | 7/1985 | Sadones | |
| 4,566,935 A | 1/1986 | Hornbeck | |
| 4,571,603 A | 2/1986 | Hornbeck et al. | |
| 4,596,992 A | 6/1986 | Hornbeck | |
| 4,615,595 A | 10/1986 | Hornbeck | |
| 4,617,608 A | 10/1986 | Blonder et al. | |
| 4,662,746 A | 5/1987 | Hornbeck | |
| 4,663,083 A | 5/1987 | Marks | |
| 4,681,403 A | 7/1987 | te Velde et al. | |
| 4,710,732 A | 12/1987 | Hornbeck | |
| 4,748,366 A | 5/1988 | Taylor | |
| 4,786,128 A | 11/1988 | Birnbach | |
| 4,790,635 A | 12/1988 | Apsley | |
| 4,856,863 A | 8/1989 | Sampsell et al. | |
| 4,859,060 A | 8/1989 | Kitagirin et al. | |
| 4,900,136 A | 2/1990 | Goldburt et al. | |
| 4,900,395 A | 2/1990 | Syverson et al. | |
| 4,937,496 A | 6/1990 | Neiger et al. | |
| 4,954,789 A | 9/1990 | Sampsell | |
| 4,956,619 A | 9/1990 | Hornbeck | |
| 4,965,562 A | 10/1990 | Verhulst | |
| 4,982,184 A | 1/1991 | Kirkwood | |
| 5,018,256 A | 5/1991 | Hornbeck | |
| 5,022,745 A | 6/1991 | Zahowski et al. | |
| 5,028,939 A | 7/1991 | Hornbeck et al. | |
| 5,037,173 A | 8/1991 | Sampsell et al. | |
| 5,044,736 A | 9/1991 | Jaskie et al. | |
| 5,061,049 A | 10/1991 | Hornbeck | |
| 5,075,796 A | 12/1991 | Schildkraut et al. | |
| 5,078,479 A | 1/1992 | Vuilleumier | |
| 5,079,544 A | 1/1992 | DeMond et al. | |
| 5,083,857 A | 1/1992 | Hornbeck | |
| 5,096,279 A | 3/1992 | Hornbeck et al. | |
| 5,099,353 A | 3/1992 | Hornbeck | |
| 5,124,834 A | 6/1992 | Cusano et al. | |
| 5,136,669 A | 8/1992 | Gerdt | |
| 5,142,405 A | 8/1992 | Hornbeck | |
| 5,142,414 A | 8/1992 | Koehler | |
| 5,153,771 A | 10/1992 | Link et al. | |
| 5,162,787 A | 11/1992 | Thompson et al. | |
| 5,168,406 A | 12/1992 | Nelson | |
| 5,170,156 A | 12/1992 | DeMond et al. | |
| 5,172,262 A | 12/1992 | Hornbeck | |
| 5,179,274 A | 1/1993 | Sampsell | |
| 5,192,395 A | 3/1993 | Boysel et al. | |
| 5,192,946 A | 3/1993 | Thompson et al. | |
| 5,206,629 A | 4/1993 | DeMond et al. | |
| 5,212,582 A | 5/1993 | Nelson | |
| 5,214,419 A | 5/1993 | DeMond et al. | |
| 5,214,420 A | 5/1993 | Thompson et al. | |
| 5,216,537 A | 6/1993 | Hornbeck | |
| 5,226,099 A | 7/1993 | Mignardi et al. | |
| 5,228,013 A | 7/1993 | Bik | |
| 5,231,532 A | 7/1993 | Magel et al. | |
| 5,233,385 A | 8/1993 | Sampsell | |
| 5,233,456 A | 8/1993 | Nelson | |
| 5,233,459 A | 8/1993 | Bozler et al. | |
| 5,254,980 A | 10/1993 | Hendrix et al. | |
| 5,272,473 A | 12/1993 | Thompson et al. | |
| 5,278,652 A | 1/1994 | Urbanus et al. | |
| 5,280,277 A | 1/1994 | Hornbeck | |
| 5,287,096 A | 2/1994 | Thompson et al. | |
| 5,287,215 A | 2/1994 | Warde et al. | |
| 5,293,272 A | 3/1994 | Jannon et al. | |
| 5,296,950 A | 3/1994 | Lin et al. | |
| 5,299,041 A | 3/1994 | Morin et al. | |
| 5,305,640 A | 4/1994 | Boysel et al. | |
| 5,311,360 A | 5/1994 | Bloom et al. | |
| 5,312,513 A | 5/1994 | Florence et al. | |
| 5,323,002 A | 6/1994 | Sampsell et al. | |
| 5,324,683 A | 6/1994 | Fitch et al. | |
| 5,325,116 A | 6/1994 | Sampsell | |
| 5,326,430 A | 7/1994 | Cronin et al. | |
| 5,327,286 A | 7/1994 | Sampsell et al. | |
| 5,330,617 A | 7/1994 | Haond | |
| 5,331,454 A | 7/1994 | Hornbeck | |
| 5,339,116 A | 8/1994 | Urbanus et al. | |
| 5,345,328 A | 9/1994 | Fritz et al. | |
| 5,347,377 A | 9/1994 | Revelli, Jr. et al. | |
| 5,355,357 A | 10/1994 | Yamamori et al. | |
| 5,358,601 A | 10/1994 | Cathey | |
| 5,365,283 A | 11/1994 | Doherty et al. | |
| 5,381,232 A | 1/1995 | van Wijk | |
| 5,381,253 A | 1/1995 | Sharp et al. | |
| 5,401,983 A | 3/1995 | Jokerst et al. | |
| 5,411,769 A | 5/1995 | Hornbeck | |
| 5,444,566 A | 8/1995 | Gale et al. | |
| 5,446,479 A | 8/1995 | Thompson et al. | |
| 5,448,314 A | 9/1995 | Heimbuch et al. | |
| 5,452,024 A | 9/1995 | Sampsell | |
| 5,454,906 A | 10/1995 | Baker et al. | |
| 5,457,493 A | 10/1995 | Leddy et al. | |
| 5,457,566 A | 10/1995 | Sampsell et al. | |
| 5,459,602 A | 10/1995 | Sampsell | |
| 5,459,610 A | 10/1995 | Bloom et al. | |
| 5,461,411 A | 10/1995 | Florence et al. | |
| 5,474,865 A | 12/1995 | Vasudev | |
| 5,485,304 A | 1/1996 | Kaeriyama | |
| 5,489,952 A | 2/1996 | Gove et al. | |
| 5,497,172 A | 3/1996 | Doherty et al. | |
| 5,497,197 A | 3/1996 | Gove et al. | |
| 5,497,262 A | 3/1996 | Kaeriyama | |
| 5,499,037 A | 3/1996 | Nakagawa et al. | |
| 5,499,062 A | 3/1996 | Urbanus | |
| 5,500,635 A | 3/1996 | Mott | |
| 5,500,761 A | 3/1996 | Goossen et al. | |
| 5,503,952 A | 4/1996 | Suzuki et al. | |
| 5,506,597 A | 4/1996 | Thompson et al. | |
| 5,515,076 A | 5/1996 | Thompson et al. | |
| 5,517,347 A | 5/1996 | Sampsell | |
| 5,523,803 A | 6/1996 | Urbanus et al. | |
| 5,526,051 A | 6/1996 | Gove et al. | |
| 5,526,172 A | 6/1996 | Kanack | |
| 5,526,327 A | 6/1996 | Cordova, Jr. | |
| 5,526,688 A | 6/1996 | Boysel et al. | |
| 5,526,951 A | 6/1996 | Bailey | |
| 5,535,047 A | 7/1996 | Hornbeck | |
| 5,548,301 A | 8/1996 | Kornher et al. | |
| 5,551,293 A | 9/1996 | Boysel et al. | |
| 5,552,924 A | 9/1996 | Tregilgas | |
| 5,552,925 A | 9/1996 | Worley | |
| 5,559,358 A | 9/1996 | Burns et al. | |
| 5,563,398 A | 10/1996 | Sampsell | |
| 5,567,334 A | 10/1996 | Baker et al. | |
| 5,570,135 A | 10/1996 | Gove et al. | |
| 5,579,149 A | 11/1996 | Moret et al. | |
| 5,581,272 A | 12/1996 | Conner et al. | |
| 5,583,688 A | 12/1996 | Hornbeck | |
| 5,589,852 A | 12/1996 | Thompson et al. | |
| 5,597,736 A | 1/1997 | Sampsell | |
| 5,600,383 A | 2/1997 | Hornbeck | |
| 5,602,671 A | 2/1997 | Hornbeck | |
| 5,606,441 A | 2/1997 | Florence et al. | |

| Patent | Type | Date | Inventor |
|---|---|---|---|
| 5,608,468 | A | 3/1997 | Gove et al. |
| 5,610,438 | A | 3/1997 | Wallace et al. |
| 5,610,624 | A | 3/1997 | Bhuva |
| 5,610,625 | A | 3/1997 | Sampsell |
| 5,619,059 | A | 4/1997 | Li et al. |
| 5,619,365 | A | 4/1997 | Rhoades et al. |
| 5,619,366 | A | 4/1997 | Rhoads et al. |
| 5,622,814 | A | 4/1997 | Miyata et al. |
| 5,629,790 | A | 5/1997 | Neukermans et al. |
| 5,633,652 | A | 5/1997 | Kanbe et al. |
| 5,636,052 | A | 6/1997 | Arney et al. |
| 5,636,185 | A | 6/1997 | Brewer et al. |
| 5,638,084 | A | 6/1997 | Kalt |
| 5,638,946 | A | 6/1997 | Zavracky |
| 5,641,391 | A | 6/1997 | Hunter et al. |
| 5,646,768 | A | 7/1997 | Kaeiyama |
| 5,647,819 | A | 7/1997 | Fujita et al. |
| 5,650,834 | A | 7/1997 | Nakagawa et al. |
| 5,650,881 | A | 7/1997 | Hornbeck |
| 5,654,741 | A | 8/1997 | Sampsell et al. |
| 5,657,099 | A | 8/1997 | Doherty et al. |
| 5,659,374 | A | 8/1997 | Gale, Jr. et al. |
| 5,665,997 | A | 9/1997 | Weaver et al. |
| 5,673,139 | A | 9/1997 | Johnson |
| 5,674,757 | A | 10/1997 | Kim |
| 5,683,591 | A | 11/1997 | Offenberg |
| 5,703,710 | A | 12/1997 | Brinkman et al. |
| 5,706,022 | A | 1/1998 | Hato |
| 5,710,656 | A | 1/1998 | Goosen |
| 5,726,480 | A | 3/1998 | Pister |
| 5,739,945 | A | 4/1998 | Tayebati |
| 5,745,193 | A | 4/1998 | Urbanus et al. |
| 5,745,281 | A | 4/1998 | Yi et al. |
| 5,751,469 | A | 5/1998 | Arney et al. |
| 5,771,116 | A | 6/1998 | Miller et al. |
| 5,783,864 | A | 7/1998 | Dawson et al. |
| 5,784,190 | A | 7/1998 | Worley |
| 5,784,212 | A | 7/1998 | Hornbeck |
| 5,793,504 | A | 8/1998 | Stoll |
| 5,808,780 | A | 9/1998 | McDonald |
| 5,808,781 | A | 9/1998 | Arney et al. |
| 5,818,095 | A | 10/1998 | Sampsell |
| 5,822,110 | A | 10/1998 | Dabbaj |
| 5,822,170 | A | 10/1998 | Cabuz et al. |
| 5,824,608 | A | 10/1998 | Gotoch et al. |
| 5,825,528 | A | 10/1998 | Goosen |
| 5,835,255 | A | 11/1998 | Miles |
| 5,838,484 | A | 11/1998 | Gossen |
| 5,842,088 | A | 11/1998 | Thompson |
| 5,867,302 | A | 2/1999 | Fleming et al. |
| 5,896,796 | A | 4/1999 | Chih |
| 5,912,758 | A | 6/1999 | Knipe et al. |
| 5,914,803 | A | 6/1999 | Hwang et al. |
| 5,920,421 | A | 7/1999 | Choi |
| 5,943,158 | A | 8/1999 | Ford et al. |
| 5,959,763 | A | 9/1999 | Bozler et al. |
| 5,967,163 | A | 10/1999 | Pan et al. |
| 5,972,193 | A | 10/1999 | Chou et al. |
| 5,976,902 | A | 11/1999 | Shih |
| 5,986,796 | A | 11/1999 | Miles et al. |
| 5,998,293 | A | 12/1999 | Dawson et al. |
| 6,016,693 | A | 1/2000 | Viani et al. |
| 6,028,690 | A | 2/2000 | Carter et al. |
| 6,031,653 | A | 2/2000 | Wang |
| 6,038,056 | A | 3/2000 | Florence et al. |
| 6,040,937 | A | 3/2000 | Miles |
| 6,049,317 | A | 4/2000 | Thompson et al. |
| 6,055,090 | A | 4/2000 | Miles et al. |
| 6,057,903 | A | 5/2000 | Colgan et al. |
| 6,061,075 | A | 5/2000 | Nelson et al. |
| 6,099,132 | A | 8/2000 | Kaeriyama |
| 6,100,477 | A | 8/2000 | Randall et al. |
| 6,100,872 | A | 8/2000 | Aratani et al. |
| 6,113,239 | A | 9/2000 | Sampsell et al. |
| 6,115,326 | A | 9/2000 | Puma et al. |
| 6,147,790 | A | 11/2000 | Meier et al. |
| 6,158,156 | A | 12/2000 | Patrick |
| 6,160,833 | A | 12/2000 | Floyd et al. |
| 6,165,890 | A | 12/2000 | Kohl et al. |
| 6,166,422 | A | 12/2000 | Qian et al. |
| 6,180,428 | B1 | 1/2001 | Peeters et al. |
| 6,194,323 | B1 | 2/2001 | Downey et al. |
| 6,195,196 | B1 | 2/2001 | Kimura et al. |
| 6,201,633 | B1 | 3/2001 | Peeters et al. |
| 6,204,080 | B1 | 3/2001 | Hwang |
| 6,215,221 | B1 | 4/2001 | Cabuz et al. |
| 6,232,936 | B1 | 5/2001 | Gove et al. |
| 6,243,149 | B1 | 6/2001 | Swanson et al. |
| 6,246,398 | B1 | 6/2001 | Koo |
| 6,249,039 | B1 | 6/2001 | Harvey et al. |
| 6,282,010 | B1 | 8/2001 | Sulzbach et al. |
| 6,284,560 | B1 | 9/2001 | Jech et al. |
| 6,288,472 | B1 | 9/2001 | Cabuz et al. |
| 6,295,154 | B1 | 9/2001 | Laor et al. |
| 6,297,072 | B1 | 10/2001 | Tilmans et al. |
| 6,323,982 | B1 | 11/2001 | Hornbeck |
| 6,327,071 | B1 | 12/2001 | Kimura et al. |
| 6,329,297 | B1 | 12/2001 | Balish et al. |
| 6,335,831 | B2 | 1/2002 | Kowarz et al. |
| 6,351,329 | B1 | 2/2002 | Greywal |
| 6,356,254 | B1 | 3/2002 | Kimura |
| 6,358,021 | B1 | 3/2002 | Cabuz |
| 6,359,673 | B1 | 3/2002 | Stephenson |
| 6,376,787 | B1 | 4/2002 | Martin et al. |
| 6,377,233 | B2 | 4/2002 | Colgan et al. |
| 6,391,675 | B1 | 5/2002 | Ehmke et al. |
| 6,392,233 | B1 | 5/2002 | Channin et al. |
| 6,392,781 | B1 | 5/2002 | Kim et al. |
| 6,407,851 | B1 | 6/2002 | Islam et al. |
| 6,447,126 | B1 | 9/2002 | Hornbeck |
| 6,448,622 | B1 | 9/2002 | Franke et al. |
| 6,452,465 | B1 | 9/2002 | Brown et al. |
| 6,456,420 | B1 | 9/2002 | Goodwin-Johansson |
| 6,465,355 | B1 | 10/2002 | Horsley |
| 6,466,354 | B1 | 10/2002 | Gudeman |
| 6,466,358 | B2 | 10/2002 | Tew |
| 6,473,274 | B1 | 10/2002 | Maimone et al. |
| 6,480,177 | B2 | 11/2002 | Doherty et al. |
| 6,496,122 | B2 | 12/2002 | Sampsell |
| 6,513,911 | B1 | 2/2003 | Ozaki et al. |
| 6,522,801 | B1 | 2/2003 | Aksyuk et al. |
| 6,531,945 | B1 | 3/2003 | Ahn et al. |
| 6,537,427 | B1 | 3/2003 | Raina et al. |
| 6,545,335 | B1 | 4/2003 | Chua et al. |
| 6,548,908 | B2 | 4/2003 | Chua et al. |
| 6,549,338 | B1 | 4/2003 | Wolverton et al. |
| 6,552,840 | B2 | 4/2003 | Knipe |
| 6,574,033 | B1 | 6/2003 | Chen et al. |
| 6,577,785 | B1 | 6/2003 | Spahn et al. |
| 6,589,625 | B1 | 7/2003 | Kothari et al. |
| 6,600,201 | B1 | 7/2003 | Hartwell et al. |
| 6,602,791 | B2 | 8/2003 | Ouellet et al. |
| 6,606,175 | B1 | 8/2003 | Sampsell et al. |
| 6,608,268 | B1 | 8/2003 | Goldsmith |
| 6,610,440 | B1 | 8/2003 | LaFollette et al. |
| 6,618,187 | B2 | 9/2003 | Pilossof |
| 6,625,047 | B2 | 9/2003 | Coleman, Jr. |
| 6,630,786 | B2 | 10/2003 | Cummings et al. |
| 6,632,698 | B2 | 10/2003 | Ives |
| 6,635,919 | B1 | 10/2003 | Melendez et al. |
| 6,642,913 | B1 | 11/2003 | Kimura et al. |
| 6,643,069 | B2 | 11/2003 | Dewald |
| 6,650,455 | B2 | 11/2003 | Miles |
| 6,657,832 | B2 | 12/2003 | Williams et al. |
| 6,666,561 | B1 | 12/2003 | Blakley |
| 6,674,090 | B1 | 1/2004 | Chua et al. |

| | | |
|---|---|---|
| 6,674,562 B1 | 1/2004 | Miles et al. |
| 6,674,563 B2 | 1/2004 | Chui et al. |
| 6,677,225 B1 | 1/2004 | Ellis et al. |
| 6,680,792 B2 | 1/2004 | Miles |
| 6,710,908 B2 | 3/2004 | Miles et al. |
| 6,713,235 B1 | 3/2004 | Ide et al. |
| 6,720,267 B1 | 4/2004 | Chen et al. |
| 6,736,987 B1 | 5/2004 | Cho |
| 6,741,377 B2 | 5/2004 | Miles |
| 6,741,384 B1 | 5/2004 | Martin et al. |
| 6,741,503 B1 | 5/2004 | Farris et al. |
| 6,743,570 B2 | 6/2004 | Harnett et al. |
| 6,747,785 B2 | 6/2004 | Chen et al. |
| 6,747,800 B1 | 6/2004 | Lin |
| 6,756,317 B2 | 6/2004 | Sniegowski et al. |
| 6,768,097 B1 | 7/2004 | Viktorovitch et al. |
| 6,775,174 B2 | 8/2004 | Huffman et al. |
| 6,778,155 B2 | 8/2004 | Doherty et al. |
| 6,778,306 B2 | 8/2004 | Sniegowski et al. |
| 6,782,166 B1 | 8/2004 | Grote et al. |
| 6,788,175 B1 | 9/2004 | Prophet et al. |
| 6,794,119 B2 | 9/2004 | Miles |
| 6,806,110 B2 | 10/2004 | Lester et al. |
| 6,811,267 B1 | 11/2004 | Allen et al. |
| 6,812,482 B2 | 11/2004 | Fleming et al. |
| 6,819,469 B1 | 11/2004 | Koba |
| 6,822,628 B2 | 11/2004 | Dunphy et al. |
| 6,829,132 B2 | 12/2004 | Martin et al. |
| 6,844,959 B2 | 1/2005 | Huibers et al. |
| 6,853,129 B1 | 2/2005 | Cummings et al. |
| 6,855,610 B2 | 2/2005 | Tung et al. |
| 6,859,218 B1 | 2/2005 | Luman et al. |
| 6,861,277 B1 | 3/2005 | Monroe et al. |
| 6,862,022 B2 | 3/2005 | Slupe |
| 6,862,029 B1 | 3/2005 | D'Souza et al. |
| 6,867,896 B2 | 3/2005 | Miles |
| 6,870,581 B2 | 3/2005 | Li et al. |
| 6,870,654 B2 | 3/2005 | Lin et al. |
| 6,882,458 B2 | 4/2005 | Lin et al. |
| 6,882,461 B1 | 4/2005 | Tsai et al. |
| 6,905,621 B2 | 6/2005 | Ho et al. |
| 6,906,847 B2 | 6/2005 | Huibers et al. |
| 6,912,022 B2 | 6/2005 | Lin et al. |
| 6,952,303 B2 | 10/2005 | Lin et al. |
| 6,952,304 B2 | 10/2005 | Mushika et al. |
| 6,953,702 B2 | 10/2005 | Miller et al. |
| 6,958,847 B2 | 10/2005 | Lin |
| 6,967,757 B1 | 11/2005 | Allen et al. |
| 6,972,891 B2 | 12/2005 | Patel et al. |
| 6,980,350 B2 | 12/2005 | Hung et al. |
| 6,982,820 B2 | 1/2006 | Tsai |
| 6,987,432 B2 | 1/2006 | Lutz et al. |
| 6,991,995 B2 | 1/2006 | Aulnette et al. |
| 6,995,890 B2 | 2/2006 | Lin |
| 6,999,225 B2 | 2/2006 | Lin |
| 6,999,236 B2 | 2/2006 | Lin |
| 7,008,812 B1 | 3/2006 | Carley |
| 7,012,726 B1 | 3/2006 | Miles |
| 7,027,202 B1 | 4/2006 | Hunter et al. |
| 7,041,224 B2 | 5/2006 | Patel et al. |
| 7,041,571 B2 | 5/2006 | Strane |
| 7,049,164 B2 | 5/2006 | Bruner |
| 7,078,293 B2 | 7/2006 | Lin et al. |
| 7,110,158 B2 | 9/2006 | Miles |
| 7,119,945 B2 | 10/2006 | Kothari et al. |
| 7,123,216 B1 | 10/2006 | Miles |
| 7,172,915 B2 | 2/2007 | Lin et al. |
| 7,198,973 B2 | 4/2007 | Lin et al. |
| 7,221,495 B2 | 5/2007 | Miles et al. |
| 7,250,315 B2 | 7/2007 | Miles |
| 7,256,107 B2 | 8/2007 | Takeuchi et al. |
| 2001/0003487 A1 | 6/2001 | Miles |
| 2001/0026951 A1 | 10/2001 | Vergani et al. |
| 2001/0040649 A1 | 11/2001 | Ozaki |
| 2001/0040675 A1 | 11/2001 | True et al. |
| 2002/0003400 A1 | 1/2002 | Lee |
| 2002/0014579 A1 | 2/2002 | Dunfield |
| 2002/0015215 A1 | 2/2002 | Miles |
| 2002/0021485 A1 | 2/2002 | Pilossof |
| 2002/0024711 A1 | 2/2002 | Miles |
| 2002/0027636 A1 | 3/2002 | Yamada |
| 2002/0031155 A1 | 3/2002 | Tayebati et al. |
| 2002/0036304 A1 | 3/2002 | Ehmke et al. |
| 2002/0054422 A1 | 5/2002 | Carr et al. |
| 2002/0054424 A1 | 5/2002 | Miles |
| 2002/0055253 A1 | 5/2002 | Rudhard |
| 2002/0058422 A1 | 5/2002 | Jang et al. |
| 2002/0071169 A1 | 6/2002 | Bowers et al. |
| 2002/0075555 A1 | 6/2002 | Miles |
| 2002/0086455 A1 | 7/2002 | Franosch et al. |
| 2002/0110948 A1 | 8/2002 | Huang et al. |
| 2002/0117728 A1 | 8/2002 | Brosnihhan et al. |
| 2002/0126364 A1 | 9/2002 | Miles |
| 2002/0131682 A1 | 9/2002 | Nasiri et al. |
| 2002/0135857 A1 | 9/2002 | Fitzpatrick et al. |
| 2002/0137072 A1 | 9/2002 | Mirkin et al. |
| 2002/0146200 A1 | 10/2002 | Kudric et al. |
| 2002/0149828 A1 | 10/2002 | Miles |
| 2002/0168136 A1 | 11/2002 | Atia et al. |
| 2002/0186483 A1 | 12/2002 | Hagelin et al. |
| 2003/0003372 A1 | 1/2003 | Hutchinson |
| 2003/0006468 A1 | 1/2003 | Ma et al. |
| 2003/0016428 A1 | 1/2003 | Kato et al. |
| 2003/0043157 A1 | 3/2003 | Miles |
| 2003/0053078 A1 | 3/2003 | Missey et al. |
| 2003/0053233 A1 | 3/2003 | Felton |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0090350 A1 | 5/2003 | Feng et al. |
| 2003/0112096 A1 | 6/2003 | Potter |
| 2003/0123126 A1 | 7/2003 | Meyer et al. |
| 2003/0132822 A1 | 7/2003 | Ko et al. |
| 2003/0138213 A1 | 7/2003 | Jiin et al. |
| 2003/0152872 A1 | 8/2003 | Miles |
| 2003/0201784 A1 | 10/2003 | Potter |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0210851 A1 | 11/2003 | Fu et al. |
| 2003/0231373 A1 | 12/2003 | Kowarz |
| 2004/0010115 A1 | 1/2004 | Sotzing |
| 2004/0027636 A1 | 2/2004 | Miles |
| 2004/0027671 A1 | 2/2004 | Wu et al. |
| 2004/0027701 A1 | 2/2004 | Ishikawa |
| 2004/0028849 A1 | 2/2004 | Stark et al. |
| 2004/0035821 A1 | 2/2004 | Doan et al. |
| 2004/0038513 A1 | 2/2004 | Kohl et al. |
| 2004/0051929 A1 | 3/2004 | Sampsell et al. |
| 2004/0053434 A1 | 3/2004 | Bruner |
| 2004/0058532 A1 | 3/2004 | Miles et al. |
| 2004/0061543 A1 | 4/2004 | Nam et al. |
| 2004/0063322 A1 | 4/2004 | Yang |
| 2004/0080035 A1 | 4/2004 | Delapierre |
| 2004/0080807 A1 | 4/2004 | Chen et al. |
| 2004/0080832 A1 | 4/2004 | Singh |
| 2004/0087086 A1 | 5/2004 | Lee |
| 2004/0100677 A1 | 5/2004 | Huibers et al. |
| 2004/0100680 A1 | 5/2004 | Huibers et al. |
| 2004/0124073 A1 | 7/2004 | Pilans et al. |
| 2004/0124483 A1 | 7/2004 | Partridge et al. |
| 2004/0124495 A1 | 7/2004 | Chen et al. |
| 2004/0125281 A1 | 7/2004 | Lin et al. |
| 2004/0125282 A1 | 7/2004 | Lin et al. |
| 2004/0125347 A1 | 7/2004 | Patel et al. |
| 2004/0125536 A1 | 7/2004 | Arney et al. |

| | | | | | | |
|---|---|---|---|---|---|---|
| 2004/0136045 A1 | 7/2004 | Tran | | 2006/0177950 A1 | 8/2006 | Lin et al. |
| 2004/0136076 A1 | 7/2004 | Tayebati Parviz | | 2006/0256420 A1 | 11/2006 | Miles et al. |
| 2004/0145049 A1 | 7/2004 | McKinnell et al. | | 2006/0257070 A1 | 11/2006 | Lin et al. |
| 2004/0145811 A1 | 7/2004 | Lin et al. | | 2007/0064760 A1 | 3/2007 | Kragh |
| 2004/0147056 A1 | 7/2004 | McKinnell et al. | | 2007/0269748 A1 | 11/2007 | Miles |
| 2004/0147198 A1 | 7/2004 | Lin et al. | | 2008/026328 A1 | 1/2008 | Miles |
| 2004/0148009 A1 | 7/2004 | Buzzard | | 2008/0041817 A1 | 2/2008 | Lin |
| 2004/0150869 A1 | 8/2004 | Kasai | | 2008/0055699 A1 | 3/2008 | Lin |
| 2004/0160143 A1 | 8/2004 | Shreeve et al. | | 2008/0068699 A1 | 3/2008 | Miles |
| 2004/0174583 A1 | 9/2004 | Chen et al. | | 2008/0130089 A1 | 6/2008 | Miles |
| 2004/0175577 A1 | 9/2004 | Lin et al. | | | | |
| 2004/0179281 A1 | 9/2004 | Reboa | | FOREIGN PATENT DOCUMENTS | | |
| 2004/0179445 A1 | 9/2004 | Park | | | | |
| 2004/0191937 A1 | 9/2004 | Patel et al. | | CN | 157313 | 5/1991 |
| 2004/0191946 A1 | 9/2004 | Patel et al. | | CN | 1341546 | 3/2002 |
| 2004/0197526 A1 | 10/2004 | Mehta | | CN | 092109265 | 11/2003 |
| 2004/0207897 A1 | 10/2004 | Lin | | DE | 199 38 072 | 3/2000 |
| 2004/0207898 A1 | 10/2004 | Lin et al. | | DE | 102 28 946 A | 1/2004 |
| 2004/0209192 A1 | 10/2004 | Lin et al. | | DE | 198 47 455 | 4/2004 |
| 2004/0209195 A1 | 10/2004 | Lin | | EP | 0 069 226 | 1/1983 |
| 2004/0212026 A1 | 10/2004 | Van Brocklin et al. | | EP | 0 035 299 | 9/1983 |
| 2004/0217264 A1 | 11/2004 | Wood et al. | | EP | 0173808 | 3/1986 |
| 2004/0217378 A1 | 11/2004 | Martin et al. | | EP | 0 667 548 A1 | 8/1995 |
| 2004/0217919 A1 | 11/2004 | Pichl et al. | | EP | 0694801 A | 1/1996 |
| 2004/0218251 A1 | 11/2004 | Piehl et al. | | EP | 0695959 A | 2/1996 |
| 2004/0218334 A1 | 11/2004 | Martin et al. | | EP | 0 788 005 | 8/1997 |
| 2004/0218341 A1 | 11/2004 | Martin et al. | | EP | 0878824 | 11/1998 |
| 2004/0227493 A1 | 11/2004 | Van Brocklin et al. | | EP | 1197778 A | 4/2002 |
| 2004/0233498 A1 | 11/2004 | Starkweather et al. | | EP | 1 209 738 | 5/2002 |
| 2004/0240027 A1 | 12/2004 | Lin et al. | | EP | 1258860 A1 | 11/2002 |
| 2004/0240032 A1 | 12/2004 | Miles | | EP | 1 275 997 | 1/2003 |
| 2004/0240138 A1 | 12/2004 | Martin et al. | | EP | 1 452 481 A | 9/2004 |
| 2004/0245588 A1 | 12/2004 | Nikkel et al. | | EP | 1 493 711 A1 | 1/2005 |
| 2004/0263944 A1 | 12/2004 | Miles et al. | | JP | 49-004993 | 1/1974 |
| 2005/0001828 A1 | 1/2005 | Martin et al. | | JP | 05275401 A1 | 10/1993 |
| 2005/0003667 A1 | 1/2005 | Lin et al. | | JP | 9-127439 | 5/1997 |
| 2005/0014374 A1 | 1/2005 | Partridge et al. | | JP | 10500224 | 1/1998 |
| 2005/0020089 A1 | 1/2005 | Shi et al. | | JP | 10-148644 | 6/1998 |
| 2005/0024557 A1 | 2/2005 | Lin | | JP | 10-267658 | 10/1998 |
| 2005/0035699 A1 | 2/2005 | Tsai | | JP | 11-097799 | 4/1999 |
| 2005/0036095 A1 | 2/2005 | Yeh et al. | | JP | 11211999 A | 8/1999 |
| 2005/0036192 A1 | 2/2005 | Lin et al. | | JP | 11243214 | 9/1999 |
| 2005/0038950 A1 | 2/2005 | Adelmann | | JP | 2000-40831 A | 2/2000 |
| 2005/0042117 A1 | 2/2005 | Lin | | JP | 2001-085519 | 3/2001 |
| 2005/0045276 A1 | 3/2005 | Patel et al. | | JP | 2002-0287047 | 3/2001 |
| 2005/0046922 A1 | 3/2005 | Lin et al. | | JP | 2002-062490 | 2/2002 |
| 2005/0046948 A1 | 3/2005 | Lin | | JP | 2002 062493 | 2/2002 |
| 2005/0057442 A1 | 3/2005 | Way | | JP | 2002-207182 | 7/2002 |
| 2005/0068583 A1 | 3/2005 | Gutkowski et al. | | JP | 2002-243937 | 8/2002 |
| 2005/0068605 A1 | 3/2005 | Tsai | | JP | 2002-270575 | 9/2002 |
| 2005/0068606 A1 | 3/2005 | Tsai | | JP | 2002-328313 | 11/2002 |
| 2005/0069209 A1 | 3/2005 | Damera-Venkata et al. | | JP | 2002-355800 | 12/2002 |
| 2005/0078348 A1 | 4/2005 | Lin | | JP | 2003-001598 | 1/2003 |
| 2005/0098840 A1 | 5/2005 | Fuertsch et al. | | JP | 2003-305697 | 10/2003 |
| 2005/0118832 A1 | 6/2005 | Korzenski et al. | | JP | 2004-102022 A | 4/2004 |
| 2005/0128565 A1 | 6/2005 | Ljungblad | | JP | 2004-133281 | 4/2004 |
| 2005/0168849 A1 | 8/2005 | Lin | | JP | 2004106074 A | 4/2004 |
| 2005/0170670 A1 | 8/2005 | King et al. | | JP | 2004-212656 | 7/2004 |
| 2005/0195462 A1 | 9/2005 | Lin | | JP | 2004-233999 | 8/2004 |
| 2005/0195464 A1 | 9/2005 | Faase et al. | | JP | 2005-051007 | 2/2005 |
| 2005/0195467 A1 | 9/2005 | Kothari et al. | | KR | 2002-9270 | 10/1999 |
| 2005/0202649 A1 | 9/2005 | Hung et al. | | KR | 2000-0033006 | 6/2000 |
| 2006/0006138 A1 | 1/2006 | Lin | | WO | WP 91/05284 | 4/1991 |
| 2006/0024620 A1 | 2/2006 | Nikkel et al. | | WO | WO 92/10925 | 6/1992 |
| 2006/0024880 A1 | 2/2006 | Chui et al. | | WO | WO9530924 | 11/1995 |
| 2006/0066932 A1 | 3/2006 | Chui | | WO | WO9717628 | 5/1997 |
| 2006/0066935 A1 | 3/2006 | Cummings et al. | | WO | WO9952006 A2 | 10/1999 |
| 2006/0066936 A1 | 3/2006 | Chui et al. | | WO | WO9952006 A3 | 10/1999 |
| 2006/0076311 A1 | 4/2006 | Tung et al. | | WO | WO 01/14248 | 3/2001 |
| 2006/0077502 A1 | 4/2006 | Tung et al. | | WO | WO 01/63657 | 8/2001 |
| 2006/0077509 A1 | 4/2006 | Tung et al. | | WO | WO 02/24570 | 3/2002 |
| 2006/0077529 A1 | 4/2006 | Chui et al. | | WO | WO 02/079853 | 10/2002 |
| 2006/0079048 A1 | 4/2006 | Sampsell et al. | | WO | WO 03/007049 A1 | 1/2003 |

| | | |
|---|---|---|
| WO | WO 03/014789 | 2/2003 |
| WO | WO 03/052506 | 6/2003 |
| WO | WO 03/069413 A | 8/2003 |
| WO | WO03073151 A1 | 9/2003 |
| WO | WO2004006003 A1 | 1/2004 |
| WO | WO 2004/015741 | 2/2004 |
| WO | WO2004026757 A2 | 4/2004 |
| WO | WO 2004/055885 | 7/2004 |
| WO | WO 2004079056 A2 | 9/2004 |
| WO | WO 2005/019899 A1 | 3/2005 |
| WO | WO 2005/061378 | 7/2005 |
| WO | WO 2005/085932 A | 9/2005 |
| WO | WO 2006/036385 | 4/2006 |
| WO | WO 2006/036437 | 4/2006 |
| WO | WO2006/036542 | 4/2006 |

OTHER PUBLICATIONS

Yao et al., BrF3 dry release technology for large freestanding parylene microstructures and electrostatic actuators, Sensors and Actuators A, vol. 97-98, pp. 771-775, Apr. 2002.
Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).
Aratani et al., "Surface micromachined tuneable interferometer array," Sensors and Actuators, pp. 17-23 (1994).
Akasaka, "Three-Dimensional IC Trends," Proceedings of IEEE, vol. 74, No. 12, pp. 1703-1714, (Dec. 1986).
Austrian Search Report for EX64/2005 dated May 4, 2005.
Austrian Search Report for EX72/2005 dated May 13, 2005.
Austrian Search Report for EX81/2005 dated May 18, 2005.
Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Austrian Search Report dated Aug. 12, 2005.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Conner, "Hybrid Color Display Using Optical Interference Filter Array," SID Digest, pp. 577-580 (1993).
Crouse, "Self-ordered pore structure of anodized aluminum on silicon and pattern transfer" Applied Physics Letters, vol. 76, No. 1, Jan. 3, 2000. pp. 49-51.
EP 05255661.0 European Search Report (Dec. 30, 2005).
Fan et al., "Channel Drop Filters in Photonic Crystals," Optics Express, vol. 3, No. 1 (1998).
French, P.J. "Development of Surface Micromachining techniques compatable with on-chip electronics" Journal of Micromechanics and Microengineering vol. 6 No. 2, 197-211 XP 002360789 Jun. (1996) IOP Publishing.
Furneaux, et al. "The Formation of Controlled-porosity membranes from Anodically Oxidized Aluminium" Nature vo 337 Jan. 12, 1989, pp. 147-149.
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1Mbit/sec Capability for Fiber-in-the-Loop-Applications," IEEE Photonics Technology Letters, pp. 1119, 1121 (Sep. 1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.

Gosch, "West Germany Grabs the Lead in X-Ray Lithography," Electronics pp. 78-80 (Feb. 5, 1987).
Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.
Howard et al., "Nanometer-Scale Fabrication Techniques," VLSI Electronics: Microstructure Science, vol. 5, pp. 145-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jackson "Classical Electrodynamics," John Wiley & Sons Inc., pp. 568-573, date unknown.
Jerman et al., "A Miniature Fabry-Perot Interferometer with a Corrugated Silicon Diaphragm Support," (1988).
Jerman J. H. et al., "Maniature Fabry-Perot Interferometers Micromachined in Silicon for Use in Optical Fiber WDM Systems," Transducers. San Francisco, Jun. 24-27, 1991, Proceedings of the Internatioal Conference on Solid State Sensors Andactuators, New Youk IEEE, US, vol. Conf. 6, Jun. 24, 1991.
Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim et al., "Control of Optical Transmission Through Metals Perforated With Subwavelength Hole Arrays," Optic Letters, vol. 24, No. 4, pp. 256-257, (Feb. 1999).
Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).
Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).
Lieberman, "MEMS Display Looks to Give PDAs Sharper Image," EE Times (Feb. 11, 1997).
Lieberman, "Microbridges at Heart of New MEMS Displays," EE Times (Apr. 24, 1997).
Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).
Little et al., "Vertically Coupled Microring Resonator Channel Dropping Filter," IEEE Photonics Technology Letters, vol. 11, No. 2, (1999).
Magel, "Integrated Optic Devices Using Micromachined Metal Membranes," SPIE vol. 2686, 0-8194-2060-Mar. (1996).
Maboudian, et al. Critical Review: Adhesion in Surface Micromechanical Structures: J. Vac. Sci Techno. B 15(1) Jan./Feb. 1997, pp. 1-20.
MicroChem, LOR Lift-Off Resists Datasheet, 2002.
Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).
Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).
Miles, Mark, W., "A New Reflective FPD Technology Using Interferometric Modulation," The Proceedings of the Society for Information Display (May 11-16, 1997).
Nagami et al., "Plastic Cell Architecture: Towards Reconfigurable Computing For General-Purpose," IEEE, 0-8186-8900-, pp. 68-77, (May 1998).
Newsbreaks, "Quantum-trench devices might operate at terahertz frequencies," Laser Focus World (May 1993).
Oliner et al., "Radiating Elements and Mutual Coupling," Microwave Scanning Antennas, vol. 2, pp. 131-141, (1966).
Penta Vacuum MEMS Etcher Specifications, http://www.pentavacuum.com/memes.htm, Jan. 5, 2005.

Raley et al., "A Fabry-Perot Microinterferometer for Visible Wavelengths," IEEE Solid-State Sensor and Actuator Workshop, Jun. 1992, Hilton Head, SC.

Schnakenberg, et al. TMAHW Etchants for Silicon Micromachining. 1991 International Conference on Solid State Sensors and Actuators-Digest of Technical Papers. pp. 815-818.

Science and Technology, The Economist, pp. 89-90, (May 1999).

Search Report PCT/US02/13442 (Sep. 13, 2002).

Search Report PCT/US04/20330 (Nov. 8, 2004).

Search Report PCT/US05/031237.

Search Report PCT/US05/030033 and Written Opinion.

Search Report PCT/US05/030902 And Written Opinion.

Search Report and Written Opinion for PCT/US05/33558 (May 19, 2005).

Search Report PCT/US05/032331 (Jan. 9, 2006).

Search Report PCT/US05/032331 (Apr. 7, 2006).

Search Report and Written Opinion for PCT/US05/032647.

PCT/US05/029821 International Search Report (Dec. 27, 2005).

PCT/US05/030927 International Search Report (Jan. 25, 2006).

PCT/US05/031693 International Search Report.

PCT/US05/033558 Partial International Search Report (Feb. 24, 2006).

PCT/US2004/035820 International Search Report and Written Opinion (Apr. 11, 2005).

PCT/US96/17731 Search Report.

Sperger et al., "High Performance Patterned All-Dielectric Interference Colour Filter for Display Applications," SID Digest, pp. 81-83, (1994).

Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.

Stone, "Radiation and Optics, An Introduction to the Classical Theory," McGraw-Hill, pp. 340-343, (1963).

Tayebi et al. "Reducing the Effects of adhesion and friction in microelectomechanical systesm (MEMS) through surface roughening: Comparison Between theory and experiments" http://jap.ajp.org/jap/copyright.isp Journal of applied Physics 98, 073528 (2005).

Thin Film Transistors- Materials and Processes -Vol. 1 Amorphous Silicon Thin Film Transistors ed. Yue Kuo, Kluwer Academic Publishers, Boston (2004).

Walker et al., "Electron-beam-tunable Interference Filter Spatial Light Modulator," Optics Letters vol. 13, No. 5, pp. 345-347, (May 1988).

Williams et al., "Etch Rates for Micromachining Processing," Journal of Microelectromechanical Systems, vol. 5, No. 4, pp. 256-259 (Dec. 1996).

Winters et al., "The etching of silicon with $XeF_2$ vapor. Applied Physics Letters," vol. 34, No. 1, pp. 70-73 (Jan. 1979).

Winton, "A novel way to capture solar energy," Chemical Week, (May 1985).

Wu, "Design of a Reflective Color LCD Using Optical Interference Reflectors," ASIA Display '95, pp. 929-931, (Oct. 1995).

Zhou et al., "Waveguide Panel Display Using Electromechanical Spatial Modulators" SID Digest, vol. XXIX, (1998).

Xactix Xetch X3™ Specifications, http://www.xactix.com/Xetch_X3specs.htm, Jan. 5, 2005.

Xactix Xetch™ Product Information.

Wang et al., Flexible circuit-based RF MEMS Switches, Proceedings of 2001 ASME International Mechanical Engineering Congress and Exposition, pp. 1-6, 2001.

ISR and WO for PCT/US06/028096 filed Jul. 19, 2006.

IPRP for PCT/US06/028096 filed Jul. 19, 2006.

Office Action issued May 8, 2007 in U.S. Appl. No. 11/090,552.

Office Action issued Oct. 3, 2007 in U.S. Appl. No. 11/090,552.

Office Action issued May 23, 2008 in Chinese Patent Application No. 200510105060.0.

Office Action issued May 9, 2008 in Chinese Patent Application No. 200510105060.0.

Office Action issued Jan. 10, 2008 in U.S. Appl. No. 11/090,778.

Office Action issued Oct. 12, 2006 in U.S. Appl. No. 11/090,778.

Office Action issued May 2, 2006 in U.S. Appl. No. 11/090,778.

International Search Report and Written Opinion dated Aug. 22, 2005 in International Application No. PCT/US05/029821.

SUPPORT STRUCTURE FOR MEMS DEVICE AND METHODS THEREFOR

CROSS REFERENCE TO RELATED APPLICATIONS

This application claims the benefit of U.S. Provisional Application No. 60/702,080, filed Jul. 22, 2005, and U.S. Provisional Application No. 60/710,019, filed Aug. 19, 2005.

BACKGROUND

1. Field

The field of the invention relates to microelectromechanical systems (MEMS). More specifically, the field of the invention relates to interferometric modulators and methods of fabricating such interferometric modulators having supports for moving layers.

2. Description of the Related Technology

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

An embodiment provides a method of making a microelectromechanical systems device. A substrate is provided. A first electrode is formed over the substrate. At least one support structure of the device is formed by oxidizing some portions of a metal sacrificial material formed over the first electrode layer. A movable layer is formed over the sacrificial material after forming the at least one support structure. After the movable layer is formed, a cavity is created between the substrate and the movable layer.

According to another embodiment, an unreleased interferometric modulator device is provided. The unreleased interferometric modulator device includes a substrate, a first electrode formed over the substrate, a layer formed over the first electrode, and a movable layer over the layer. The layer comprises a sacrificial portion formed of a metal and a support portion. The support portion is an oxide of the metal.

According to yet another embodiment, a method is provided for making a microelectromechanical systems device. A substrate is provided. The substrate has a first electrode layer formed over the substrate. At least one support structure is formed by anodizing selected portions of a sacrificial material formed over the first electrode layer. A cavity is created between the first electrode layer and a second electrode layer.

In accordance with another embodiment, a method is provided for making a interferometric modulator device. A substrate is provided. A first electrode layer is formed over the substrate. A sacrificial material is deposited over the first electrode layer. At least one support structure of the device is formed by selectively diffusing a dopant material into the sacrificial material.

BRIEF DESCRIPTION OF THE DRAWINGS

These and other aspects of the invention will be readily apparent from the following description and from the appended drawings (not to scale), which are meant to illustrate and not to limit the invention, and wherein.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

According to preferred embodiments, an interferometric modulator display is provided with support structures (e.g., posts) formed of an oxidized metal sacrificial material. According to some embodiments, the sacrificial material may comprise metal or silicon and is selectively anodized to form support structures. According to other embodiments, a dopant material is selectively diffused into the sacrificial material to form support structures.

Figure 1:
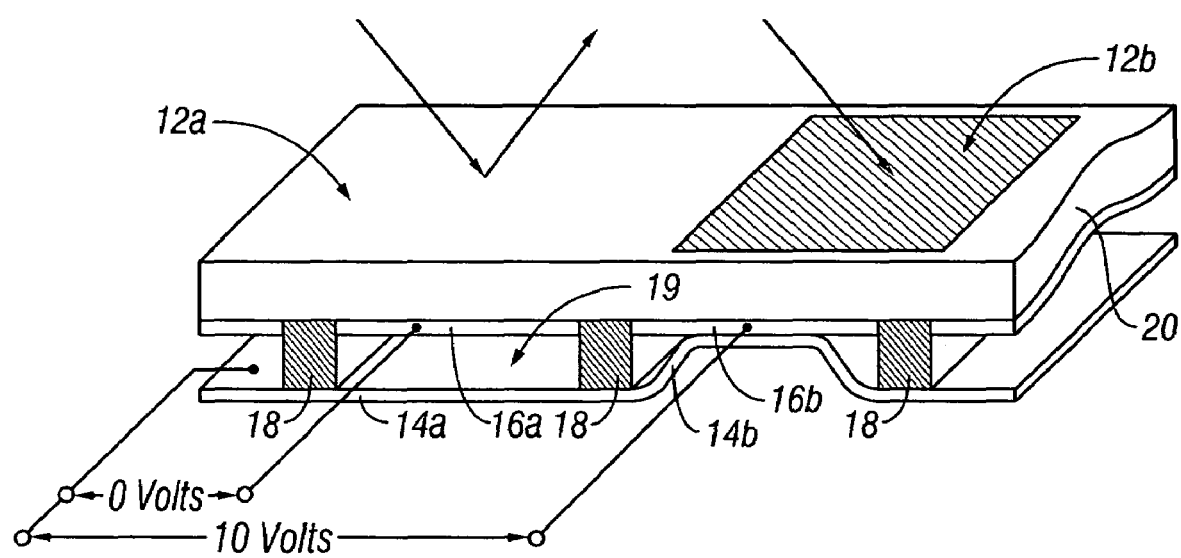
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
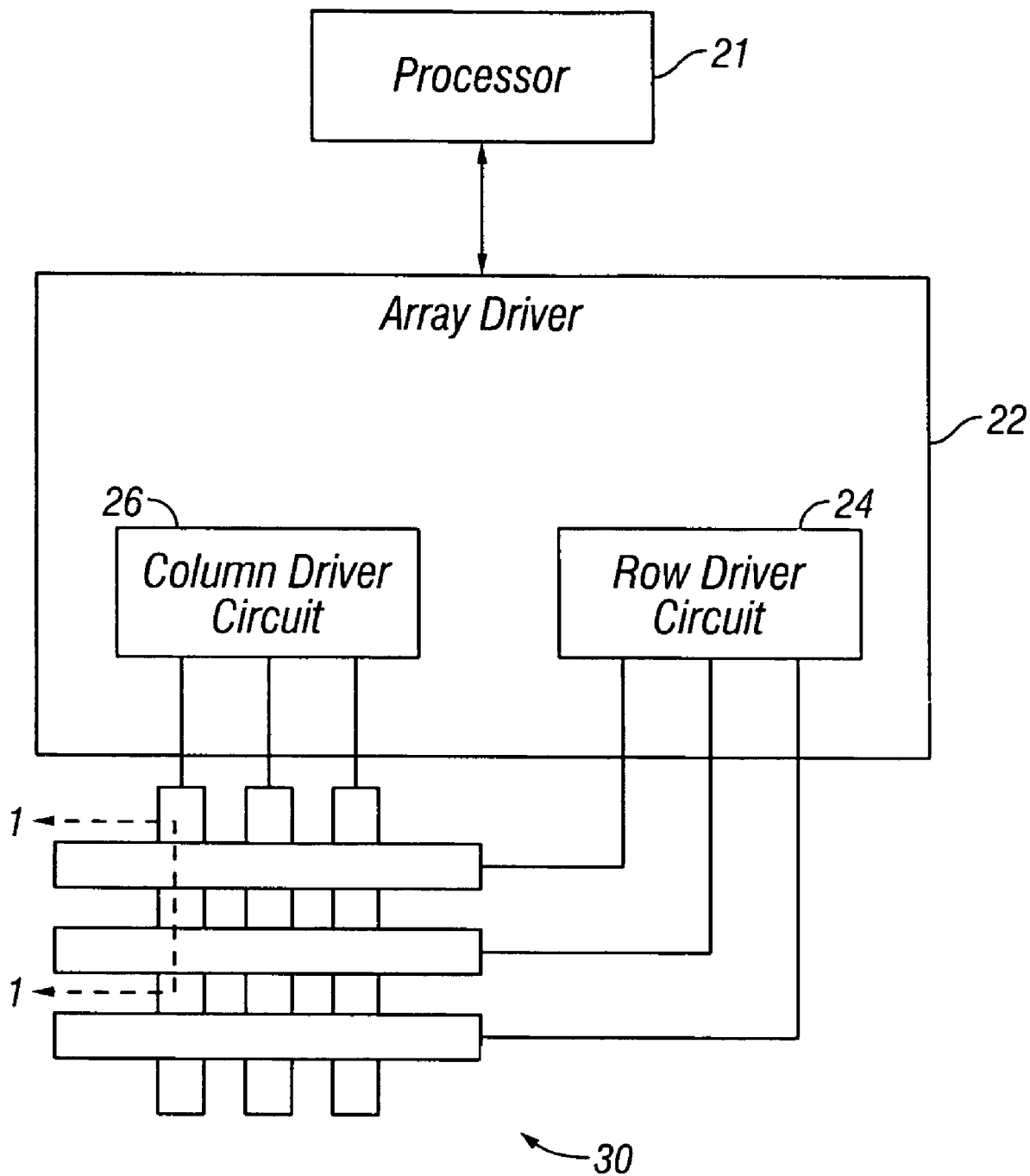
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
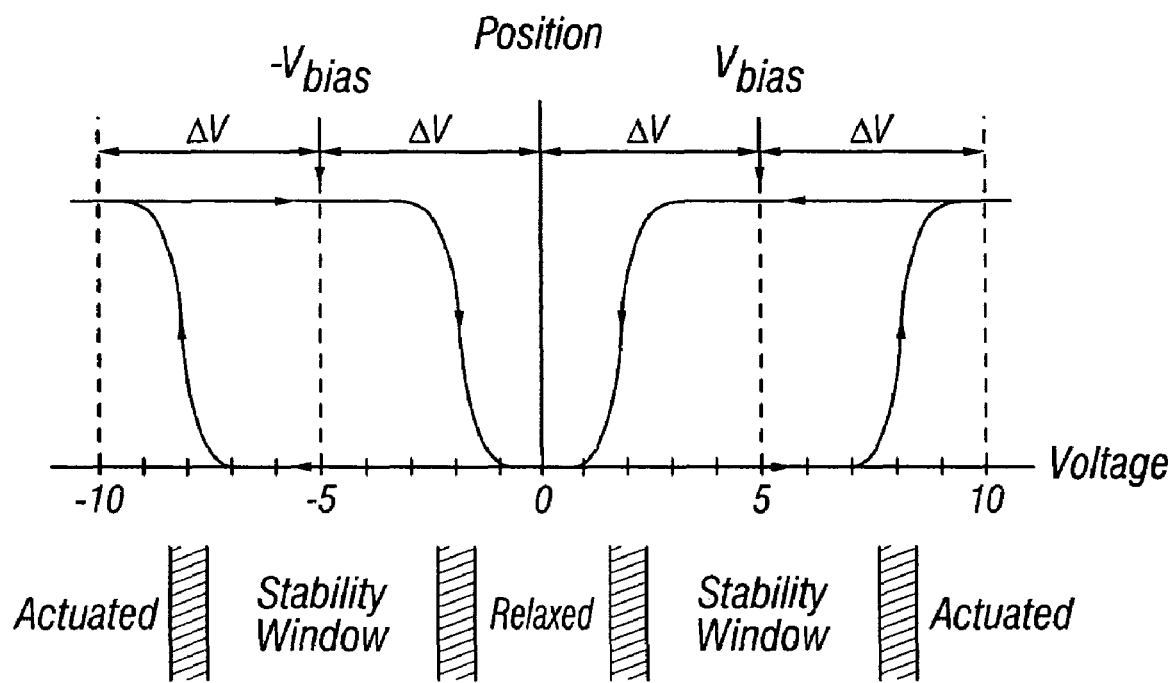
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
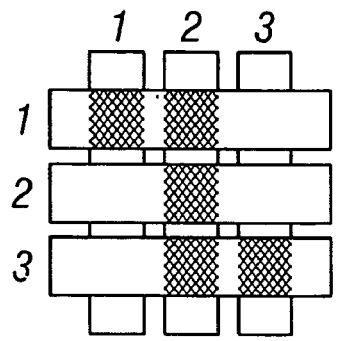
FIGS. 5A and 5B illustrate one exemplary timing diagram for row and column signals that may be used to write a frame of display data to the 3×3 interferometric modulator display of FIG. 2.
Figure 5B:
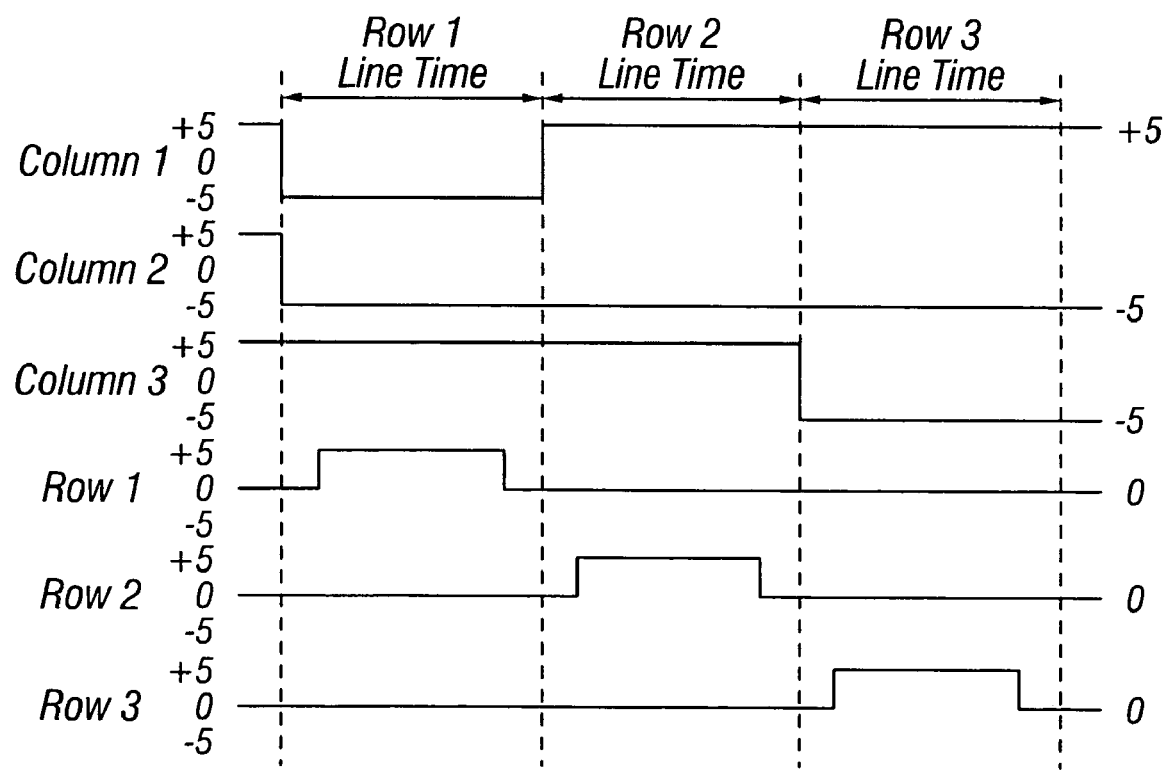

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
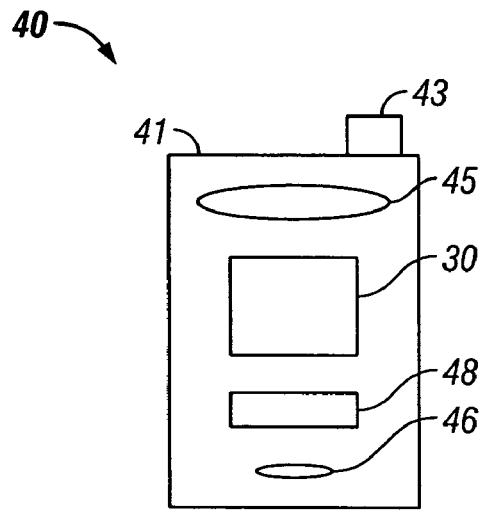
FIGS. 6A and 6B are system block diagrams illustrating an embodiment of a visual display device comprising a plurality of interferometric modulators.
Figure 6B:
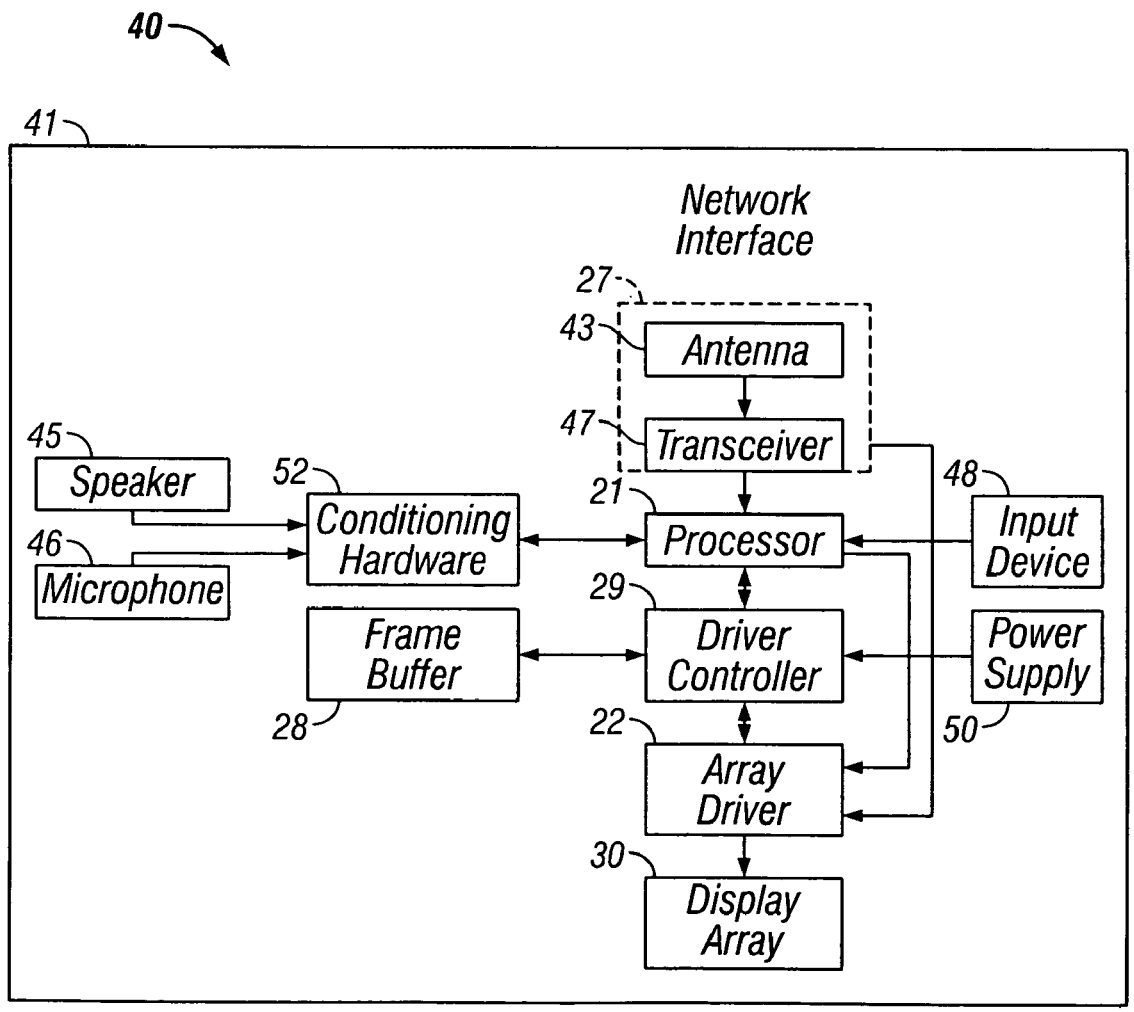

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of the exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell including a plastic solar cell, and solar-cell paint. In another embodiment, the power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
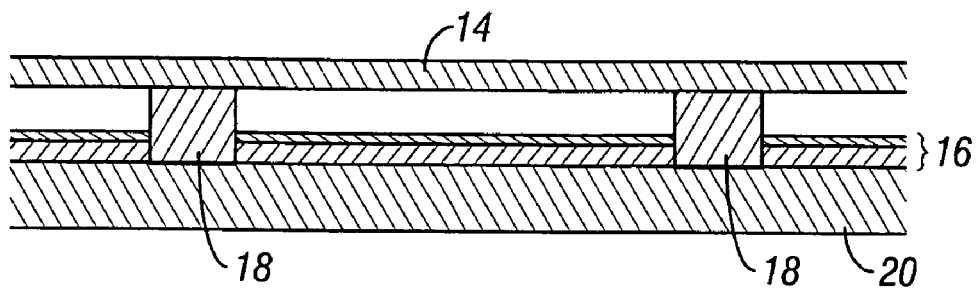
FIG. 7A is a cross section of the device of FIG. 1.
Figure 7B:
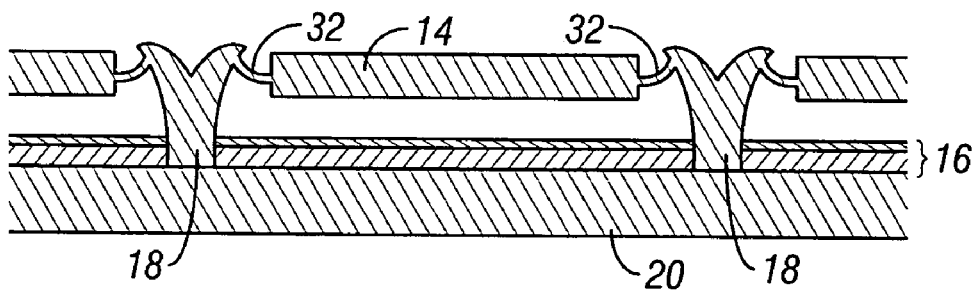
FIG. 7B is a cross section of an alternative embodiment of an interferometric modulator.
Figure 7C:
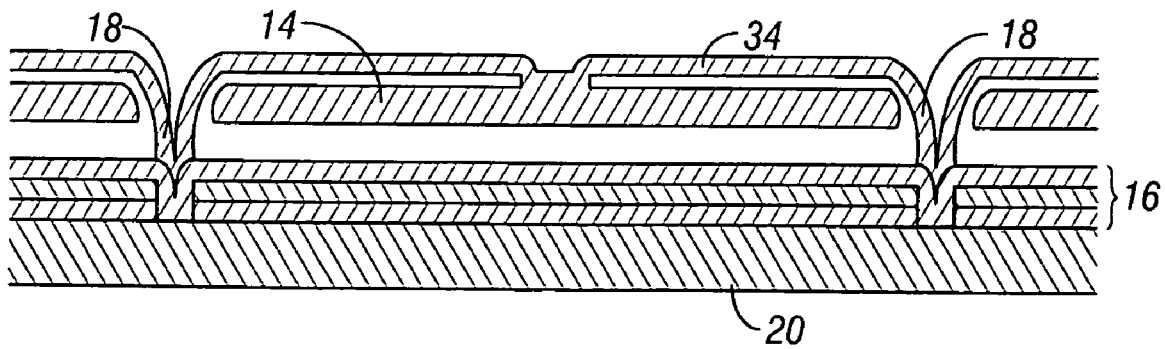
FIG. 7C is a cross section of another alternative embodiment of an interferometric modulator.
Figure 7D:
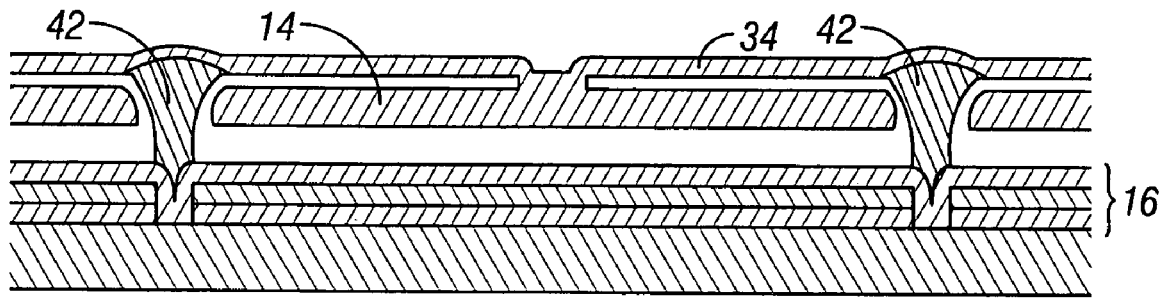
FIG. 7D is a cross section of yet another alternative embodiment of an interferometric modulator.
Figure 7E:
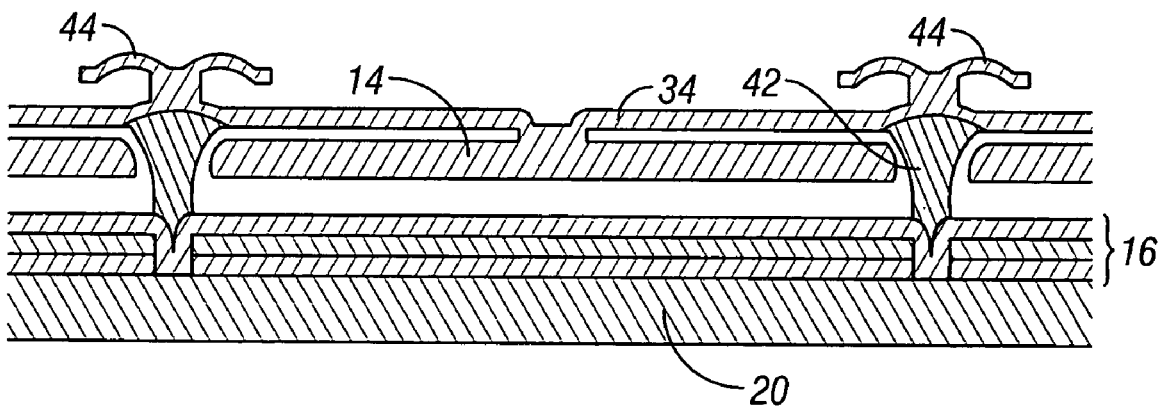
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support structures, which can comprise elongate walls or rails and/or isolated posts. For example, an array of cavities can be formed by suspending columns of mechanical layers over rows of support rails while posts can stiffen the mechanical layer within each cavity. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Layers, materials, and/or other structural elements may be described herein as being "on," "over," "above," "between," etc. in relation to other structural elements. As used herein, these terms can mean directly or indirectly on, over, above, between, etc., as a variety of intermediate layers, material, and/or other structural elements can be interposed between structural elements described herein. Similarly, structural elements described herein, such as substrates or layers, can comprise a single component (e.g., a monolayer) or a multi-component structure (e.g., a laminate comprising multiple layers of the recited material, with or without layers of additional materials). In addition to the above-mentioned connotations, the term "on," as used herein, can denote that a structural element is attached, connected, joined, or otherwise associated with another element in any manner maintaining the elements in proximity to one another. A structural element described as "on" another can be integral to, or separate/distinct from the other element, and the elements can be associated permanently, irreversibly, etc., or removably, separably, etc. Use of the term "one or more" with respect to an object or element does not, in any way, indicate the absence of a potential plural arrangement of objects or elements for which the term is not used. The term "microelectromechanical device," as used herein, refers generally to any such device at any stage of manufacture.

FIGS. 8A-8H show a method of forming an interferometric modulator having support structures or posts that are formed by selectively oxidizing a metal sacrificial material formed over the dielectric layer 130 of the optical stack 16. The oxidized portions of the metal sacrificial material are chemically altered to be resistant to a release-etch. In this instance, the support structures can even be formed from the same sacrificial material that fills the cavity prior to the release etch. The unoxidized portions of the metal sacrificial material are removed by a release etch to form the optical cavity.

Figure 8A:
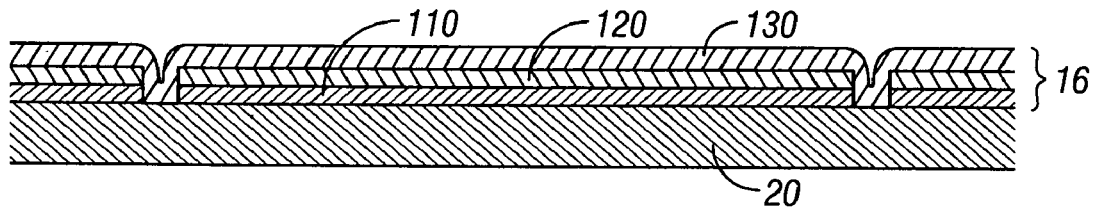
FIGS. 8A-8H are cross sections of an interferometric modulator having posts formed by selectively oxidizing a sacrificial material, in accordance with an embodiment.

According to this embodiment, an optical stack 16, such as the ones shown in FIGS. 7A-7E, is formed on a transparent substrate 20. As discussed above, the optical stack 16 typically comprises several integrated or fused layers, including a first electrode layer 110, such as ITO, a partially reflective layer 120, such as chromium, and a dielectric layer 130. The layers of the optical stack 16 are preferably patterned into parallel strips to form row electrodes. Typically, as shown in FIG. 8A, the layers of the optical stack 16 are deposited onto a transparent substrate 20, preferably deposited by conventional deposition techniques, such as, for example, some form of sputtering, physical vapor deposition (PVD), chemical vapor deposition (CVD), spin-on dielectric (SOD) and spin-on glass (SOG). The dielectric layer 130 of the optical stack 16 is preferably formed of silicon dioxide ($SiO_2$). In other arrangements, the dielectric layer 130 is formed of other insulating materials and can optionally include one or more etch stop layers to protect the optical stack 16 from subsequent etch steps. As is understood by the skilled artisan, etch stop layers are highly resistant to certain etching techniques to protect the material over which it is formed. Suitable materials for etch stop layers are known in the art and include, for example, $Al_2O_3$, titanium, tungsten, amorphous silicon, germanium, and combinations thereof.

Figure 8B:
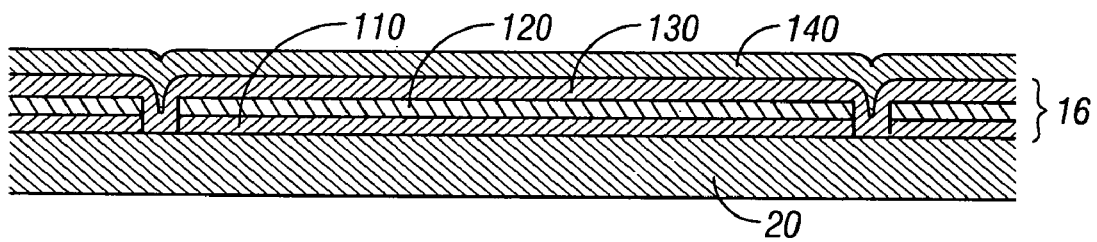

According to this embodiment, a sacrificial material 140 is deposited over the dielectric layer 130, as shown in FIG. 8B. The sacrificial material 140 is preferably deposited (and later selectively removed) over the optical stack 16 to a thickness suitable to create a resonant optical cavity 180 (FIG. 8H) between the optical stack 16 and a movable layer 170 (FIG. 8H) that will be deposited over the sacrificial material 140. The thickness of the sacrificial material 140 is thus selected for a particular choice of reflected color in the relaxed condition. In some arrangements, multiple thicknesses are deposited at different regions of the substrate to produce multiple different colors, such as red, green, and glue for an RGB display system. In an exemplary embodiment, a modulator having a cavity with the largest height (formed by a sacrificial layer having the greatest thickness) reflects red light, a modulator having a cavity with an intermediate height (formed by a sacrificial layer having an intermediate thickness) reflects green light, and a modulator having a cavity with the smallest height (formed by a sacrificial layer having the smallest thickness) reflects blue light.

In a preferred embodiment, the sacrificial material 140 comprises aluminum (Al). In other embodiments, this sacrificial material may be formed of other metals, including, but not limited to, tantalum (Ta), tungsten (W), magnesium (Mg), titanium (Ti), and molybdenum (Mo). All of these metal sacrificial materials can be selectively etched, relative to the exposed dielectric and electrode materials, with selective etch chemistries. For example, fluorine containing etchants (e.g., $XeF_2$) etches each of the listed metals significantly faster (e.g., >10 times, preferably >40 times faster) than $SiO_2$, $Al_2O_3$, or Al. The skilled artisan will appreciate that other etchants, including those described below, may be used to selectively etch the metal sacrificial materials.

Figure 8C:
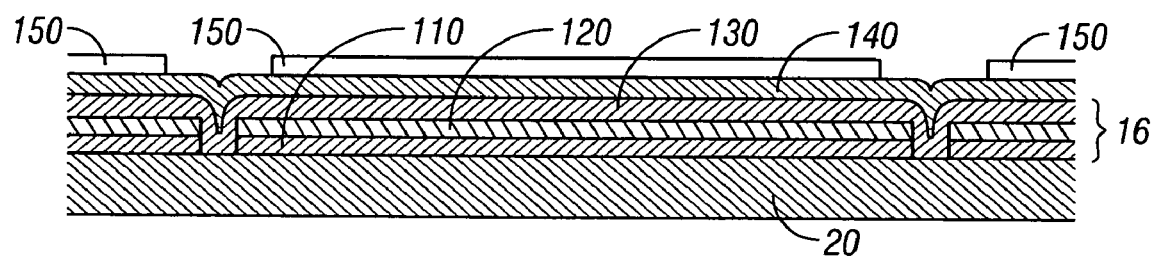
Figure 8D:
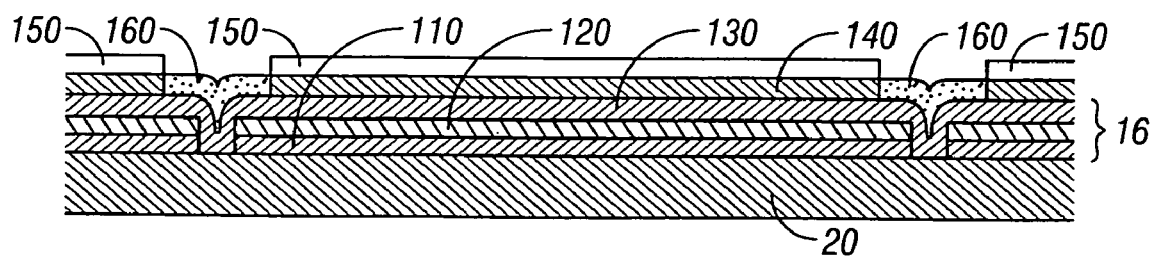

As illustrated in FIGS. 8C and 8D, according to one embodiment, interferometric modulator structure production is continued by selectively oxidizing the sacrificial material 140 to form oxidized or metal oxide portions 160. These oxidized portions 160 will form support structures of the device, as will described in more detail below. According to a preferred embodiment, the portions 160 are oxidized by forming a mask (e.g., photoresist) 150 over the sacrificial material 140 and oxidizing the unmasked portions of the sacrificial material 140. These metal oxide portions 160 are chemically altered such that they are resistant to a subsequent release etch, which will be described in more detail below.

According to a preferred embodiment, portions 160 of the metal sacrificial material 140 can be anodized to form an oxide of the metal that forms the sacrificial material 140. The sacrificial material 140 comprises an anodizable material, including, but not limited to, aluminum, magnesium, titanium, tantalum, and molybdenum. The oxides (e.g., $Ta_2O_5$, and $TiO_2$) of most of these materials are insulators and are resistant to most metal etch chemicals, such as $XeF_2$. The skilled artisan will understand that suitable etchants for a sacrificial material 140 comprising aluminum include, but are not limited to, phosphoric acid and chlorine-based etchants, such as HCl. The portions 160 are anodized by masking the sacrificial material 140 and anodizing the unmasked portions of the sacrificial material 140. The skilled artisan will understand that the anodizing may be performed by applying a voltage between the sacrificial material 140 and another electrode. The voltage may be applied through, for example, an electrolyte solution. The metal oxide portions 160 will form support structures of the device. The skilled artisan will understand that anodizing certain portions 160 of the sacrificial material 140 alters the chemical properties of those portions 160 and that anodization results in the metal oxide portions 160 being resistant to a subsequent release etch. The skilled artisan will appreciate that the anodized portions 160 are mechanically and chemically very stable and have a very smooth and flat surface.

According to an alternative embodiment, instead of anodizing a sacrificial material 140 comprising a metal, a sacrificial material 140 comprising silicon is selectively oxidized by anodizing to form the anodized portions 160, which will serve as support structures of the device. It will be understood that, in this embodiment, these anodized portions 160 are silicon oxide and are resistant to a subsequent release etch by chemical etchants, such as $XeF_2$. The skilled artisan will appreciate that any material capable of being anodized and resistant to a release etch may be used as a sacrificial material 140, in accordance with the method described above, to form support structures of the device. The skilled artisan will appreciate that the sacrificial material 140 may comprise any anodizable material that is selectively etchable with respect to its oxide, which is also chemically stable.

The sacrificial material 140 is preferably selected such that the sacrificial material 140 is selectively and/or preferentially etchable over the exposed dielectric 130 and electrode materials in a release etch. The sacrificial material 140 is selectively or preferentially etchable relative to the exposed dielectric 130 and electrode materials if an etchant can etch the sacrificial material 140 at a substantially greater rate than the exposed dielectric 130 and electrode materials (e.g., at a rate of greater than about 5×, preferably greater than about 10×, and more preferably greater than about 40× the rate of etching of the exposed dielectric and electrode materials). The exposed dielectric 130 and electrode materials are thus substantially resistant to etching under conditions under which the sacrificial material 140 is substantially susceptible to etching. Those skilled in the art will understand that the selection of the sacrificial material 140 will depend on a variety of factors, including the methods and conditions used to deposit the materials (which can affect the physical and/or chemical properties of the materials), and the etching conditions (including the nature of the etching process and the particular etchant used) during removal of the sacrificial material. Those skilled in the art will also understand that all materials are etchable under the appropriate conditions and that the description herein of a material as selectively or preferentially etchable or etch resistant is in comparison with other materials present in the device under the particular conditions to which the materials are exposed. Thus, in many instances, the selection of a sacrificial material that is selectively or preferentially etchable relative to other materials is determined empirically, under controlled conditions. Alternatively, a wide variety of etching methods, systems, and materials that provide for selective etching of materials of interest are known in the art and/or commercially available.

Figure 8E:
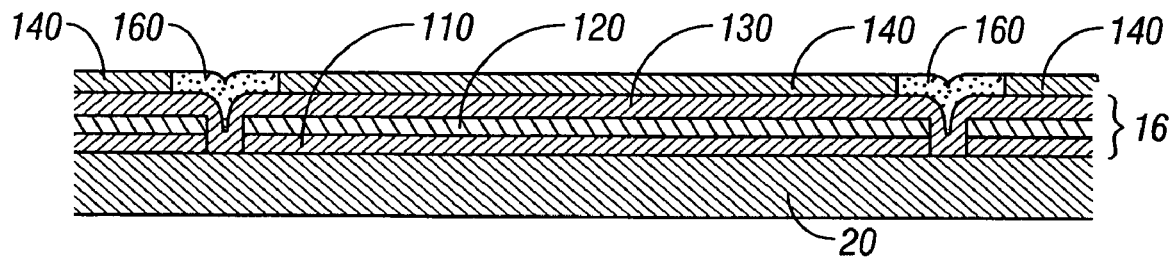
Figure 8F:
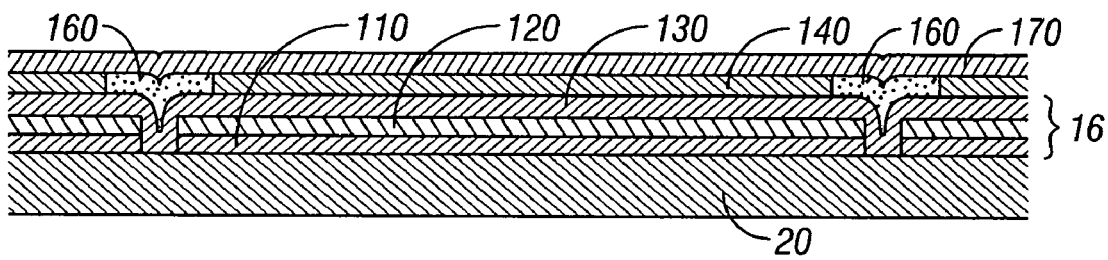

After the oxide portions 160 are formed, the mask 150, is preferably removed, as illustrated in FIG. 8E. After the mask 150 is removed, a movable layer 170 is preferably deposited (and subsequently patterned and etched) over the structure to form the pre-release or unreleased structure illustrated in FIG. 8F. In the illustrated embodiment, the movable layer 170 functions as a movable reflective layer or second electrode as well as a mechanical layer, and thus may be referred to as a mechanical layer, a movable layer, a deformable layer, and/or electrode. The movable layer 170 may comprise a fully reflective, flexible metal, as shown in FIGS. 7A, 7B, and 8F, or it may support a separate mirror, as shown in FIGS. 7C-7E (in which case a mirror layer(s) is first deposited, patterned and etched, a sacrificial material deposited and patterned thereover, and the mechanical layer deposited thereover). Suitable materials for the movable layer 170 include, but are not limited to, aluminum, chromium, and other materials typically used for the electrode. In a preferred embodiment, the movable layer 170 comprises a nickel mechanical layer over an aluminum mirror layer. The movable layer 170 preferably connects, either directly or indirectly, to the substrate 20 around the perimeter of the movable layer 170.

Figure 8G:
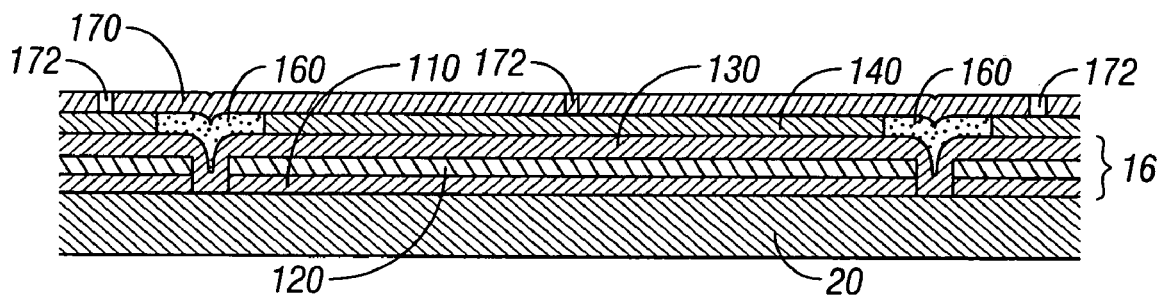

After the movable layer 170 is deposited and other steps to complete the device (e.g., patterning columns to cross with rows), the sacrificial material 140 is selectively removed. The skilled artisan will appreciate that the movable layer 170 may also be etched with openings or holes 172 so that the etch gas used for sacrificial layer removal can reach the sacrificial material 140, as shown in FIG. 8G. The skilled artisan will understand that the openings 172 can be etched by masking the movable layer 170 with a mask (not shown) formed of, for example, photoresist, and etching through the mask. The mask is removed after the openings 172 are etched. It will be understood that, as part of the overall packaging process, the interferometric modulators are subsequently sealed and protected from the environment surrounding the package containing the interferometric modulators. Preferably, such holes or openings have a diameter as small as the photolithographic system will permit. In an embodiment, holes or openings have a diameter in the range of about 2-6 microns. It will be understood that a stepper tool may be used to form openings that are smaller, less than one micron, and more preferably less than 0.5 micron. The skilled artisan will understand that the size, spacing, and number of openings will affect the rate of removal of the sacrificial material 140.

Figure 8H:
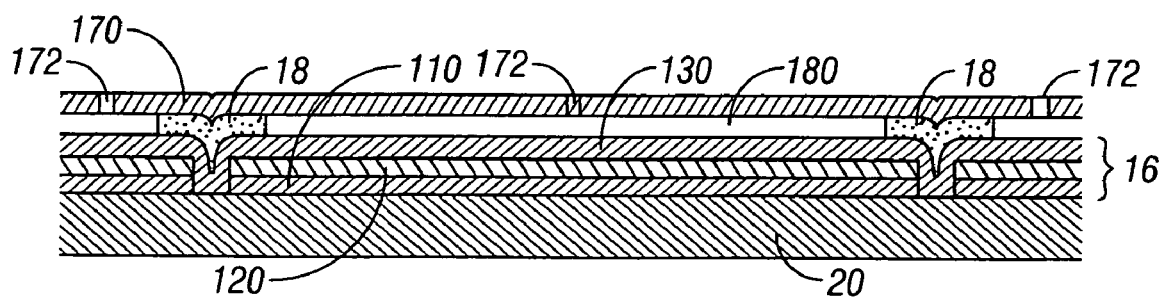

As shown in FIG. 8H, the sacrificial material 140 is removed between the oxidized or anodized portions (which are shown as support structure 18 in FIG. 8H), preferably using a selective gas etching process (e.g., selective to the mirror or movable layer 170 and dielectric 130), to create the optical cavity 180 between the movable layer 170 and the dielectric layer 130 of the optical stack 16. Thus, the unaltered portions of the sacrificial material 140 are removed by a removal process, such as selective etching. After selective etching of the sacrificial material 140, the movable layer 170 is supported by and rests on the support structures 18 formed by the oxidized or anodized portions of the sacrificial material 140.

Various etching processes and etchants may be used to remove the sacrificial material 140. Standard etching techniques well known in the art may be used to remove the sacrificial material 140. Suitable etching techniques include, for example, wet etching methods and dry etching methods. The particular gas etching process will depend on the material to be removed.

Chemical dry etching methods typically involve exposure of gaseous, chemically reactive etchants to the sacrificial material 140, converting the material into volatile products that are removed, for example, by a vacuum source. Examples of etchants useful in dry etching methods include mixtures of one or more gases, for example mixtures of an inert gas (e.g., Xe or Ar) with, for example, $F_2$, $Cl_2$, $N_xF_y$ (e.g., $NF_3$), $C_xF_y$ (e.g., $C_2F_6$), and/or $Si_xF_y$ (e.g., $SiF_4$). For example, gaseous or vaporous xenon difluoride ($XeF_2$) may be used as a dry etchant release gas for selectively removing a silicon, tantalum, molybdenum, titanium, or tungsten sacrificial layer relative to the dielectric 130 and the mirror or movable layer 170. It will be understood that this etching process is a selective etching process that does not etch the dielectric, semi-reflecting, or electrode materials, such as the illustrated movable layer 170 and the lower dielectric layer 130, or any etch-stop materials over these structures. For example, $XeF_2$ does not appreciably etch silicon dioxide, aluminum, aluminum oxide, nickel, or photoresist.

An exemplary wet etchant is a phosphoric/acetic/nitric acid or "PAN" etchant, which can selectively remove, for example, Al or Ge, relative to various materials, including, but not limited to, silicon oxide, silicon nitride, titanium, nickel, chromium, ITO, silicon carbide, and amorphous silicon. The skilled artisan will appreciate that a sacrificial material 140 comprising tantalum and titanium, for example, may be removed by both wet and dry etch chemistries, including, but not limited to, etching by etchants, such as $XeF_2$, fluorine plasma ($CF_4$, $NF_3$, $SF_6$), and $Cl_2$. A sacrificial material 140 comprising magnesium is preferably removed using a wet etch chemistry, including, but not limited to, etching by etchants, such as HCl and $HNO_3$.

A sacrificial material 140 comprising aluminum is preferably removed using a wet etch chemistry rather than a dry etch chemistry. Suitable wet etchants for an aluminum sacrificial material 140 include, but are not limited to, bases such as ammonium hydroxide ($NH_4OH$) and TMAH organic base, phosphoric acid, HCl, PAN etchant, NaOH, and KOH. Although a wet etchant is preferred for removal of aluminum, a dry etchant, such as $Cl_2$ plasma, can be used to remove aluminum. The skilled artisan will appreciate that wet etchants used to etch an aluminum sacrificial material may also remove aluminum, if any, on the backside of the movable layer 170 and that any such aluminum on the backside of the movable layer 170 should be protected from the etching with a thin (e.g., <100 Å) dielectric layer. The skilled artisan will appreciate that, for embodiments in which the movable layer 170 has aluminum on the backside, nickel (or any metal that is resistant to the etchant) can be used as the reflective material on the backside of the movable layer 170, as nickel is resistant to etchants for aluminum.

In some embodiments, the etching is monitored, for example, by monitoring the reflectivity of the device, or the etching products released. In other embodiments, the etching is conducted for a predetermined period of time. Those skilled in the art will understand that the etching rate of a layer depends on the thickness of the layer. The etching rate also depends on the process conditions, such as pressure, temperature, and concentration of the gas if it is mixed with another gas, such as $O_2$, Ar, He, Ne, $N_2$, etc. As described above, the movable layer 170 may also be patterned to have openings or holes 172 so that the etch gas used for sacrificial layer removal can reach the sacrificial material 140. The skilled artisan will understand that the etching rate also depends on the number of the openings 172 and the size of the openings 172.

In accordance with this embodiment, the resulting final structure of the interferometric modulator is shown in FIG. 8H. As illustrated in FIG. 8H, the oxidized or anodized portions serve as support structures 18 of the device.

In accordance with another embodiment, support structures 18 of the device are formed by selectively diffusing a dopant material into the sacrificial material 140 after the sacrificial material 140 is deposited. As illustrated in FIGS. 9A-9D, in this embodiment, after deposition of the sacrificial material 140 (FIG. 8B), interferometric modulator structure production is continued by selectively diffusing a dopant material 210 into the sacrificial material 140. In this embodiment, the sacrificial material 140 may also comprise the suitable materials listed above. Alternatively, in this embodiment, the sacrificial material 140 may comprise molybdenum (Mo). It will be understood that, in this embodiment, the substrate 20 is preferably formed of a material that can withstand high temperatures (e.g., preferably greater than 600° C., and more preferably greater than 800° C.), as diffusion processes typically require high temperatures although lower temperatures may be used, depending on the dopant materials 210 and sacrificial materials 140. The skilled artisan will understand that if the transparent substrate 20 is formed of amorphous glass, it should not be subjected to temperatures higher than the strain point of the glass substrate, which is typically about 666° C. However, the skilled artisan will appreciate that other materials, such as sapphire and quartz, may be used for the transparent substrate 20 and that such other materials may be subjected to higher temperatures than amorphous glass.

The dopant material 210 may be a material that is resistant to an etchant used to remove the sacrificial material, such as, for example, silicon, aluminum, molybdenum, chromium, nickel, iron, gold, platinum, and sodium. The skilled artisan will understand that the choice of dopant material 210 depends on the material of the sacrificial material 140. For example, if the sacrificial material 140 comprises silicon, the dopant material 210 may comprise, for example, oxygen, aluminum, zinc, copper, gold, platinum, or sodium. In one embodiment, a nickel dopant material 210 can be selectively diffused into a sacrificial material 140 comprising silicon at a temperature as low as 270° C.

Figure 9A:
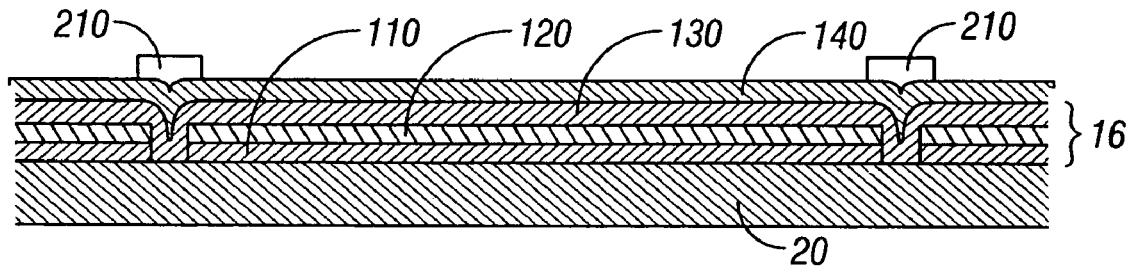
FIGS. 9A-9D are cross sections of an interferometric modulator formed in accordance with another embodiment in which a dopant material is selectively diffused into the sacrificial material.
Figure 9B:
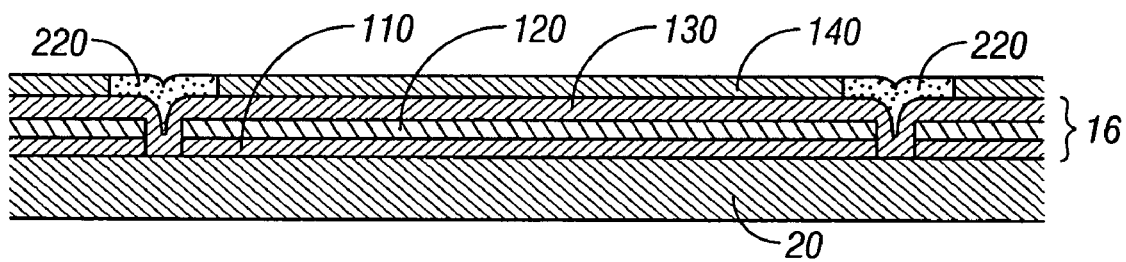

According to one embodiment, the dopant material 210 is a solid material that is deposited over the sacrificial material 140. After the dopant material 210 is deposited, the dopant material 210 preferably is patterned, by techniques known in the art, such that certain portions of the sacrificial material 140 are covered by the dopant material 210 to yield the structure shown in FIG. 9A. In one unillustrated embodiment, the sacrificial material is first masked and a solid dopant material is deposited over the mask, making contact with the sacrificial material in the mask openings. In the illustrated embodiment, to pattern the dopant material 210, the dopant material 210 is deposited first and subsequently masked and selectively etched. The portions of the sacrificial material 140 covered with the dopant material 210 will serve as support structures 18 (FIG. 9D) in this embodiment. The structure is then baked so that the dopant material 210 diffuses into the sacrificial material 140 to form diffused portions 220, which will serve as support structures, as shown in FIG. 9B. Diffusion of the dopant material 210 into portions 220 of the sacrificial material 140 causes those portions 220 to become resistant to a release etch.

In an alternative embodiment, instead of diffusing a solid dopant material, a gaseous dopant material is selectively diffused into the sacrificial material 140. The dopant material 210 is selectively diffused by diffusing a gaseous dopant material 210 into portions 220 of the sacrificial material 140 through a mask (not shown) over the sacrificial material 140, yielding the structure shown in FIG. 9B. The areas in which the gaseous dopant material 210 diffuses into the sacrificial material 140 become the support structures 18 (FIG. 9D) of the device.

Figure 9C:
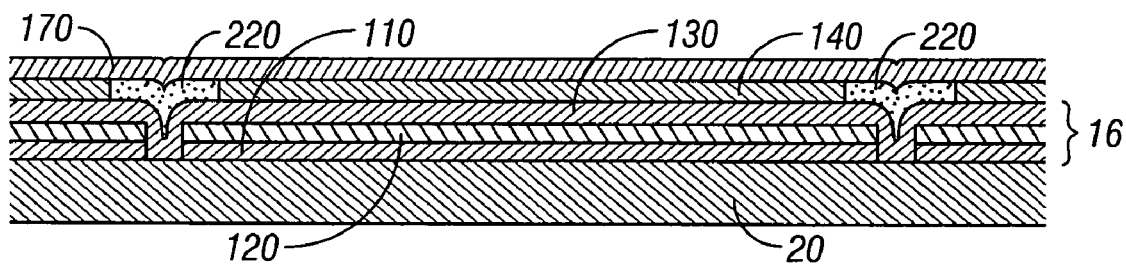

After the dopant material 210 selectively diffuses into the sacrificial material 140, a movable layer 170 is preferably deposited to form the unreleased structure shown in FIG. 9C. As described above, the movable layer 170 also functions as a movable reflective layer or second electrode, and thus may be referred to as a mechanical layer, a deformable layer, and/or electrode. The movable layer 170 may comprise a fully reflective, flexible metal, as shown in FIGS. 7A, 7B, 8, and 9, or it may support a separate mirror, as shown in FIGS. 7C-7E. Suitable materials for the movable layer 170 include, but are not limited to, aluminum, nickel, chromium, and other materials typically used for the electrode. The movable layer 170 preferably connects, either directly or indirectly, to the substrate 20 around the perimeter of the movable layer 170.

Figure 9D:
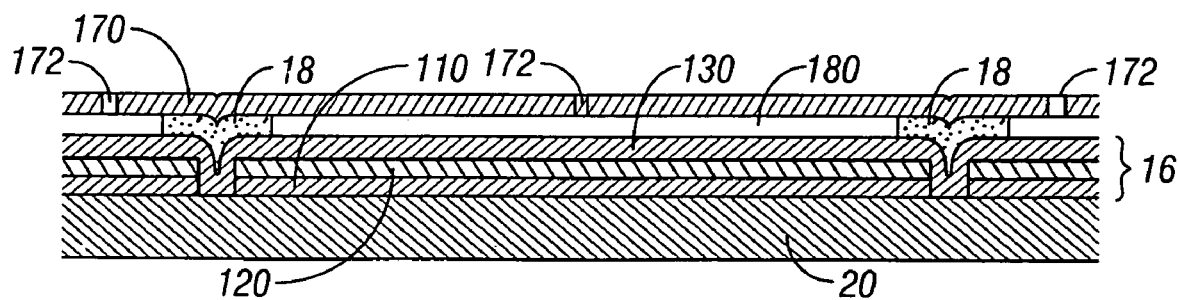

After the movable layer 170 is deposited over the sacrificial material 140 and other steps to complete the device (e.g., patterning columns to cross with rows), the sacrificial material 140 is selectively removed to form the optical cavity 180, as illustrated in FIG. 9D. A release etch is performed to remove certain portions of the sacrificial material 140 (portions not diffused with dopant material 210), leaving only the doped portions (portions having altered chemical properties), which form the support structures 18, as shown in FIG. 9D.

As described above, it will be understood that standard etching techniques may be used to remove the sacrificial material 140 and that the particular gas etching process will depend on the material to be removed. It will be understood that the etching process is a selective etching process that does not significantly etch the dielectric, semi-reflecting, or electrode materials, such as the illustrated movable layer 170 and the lower dielectric layer 130, or any etch-stop materials over these structures. The skilled artisan will understand that the dopant material 210 may comprise any material that causes the diffused portion of the sacrificial material 140 to be resistant to the etchant used. For example, if the sacrificial material 140 comprises silicon, it can be selectively diffused with a dopant material 210, such as oxygen, and a fluorine-based etchant can be used for removing the sacrificial material 140. It will be understood that oxygen can be used as the dopant material 210 because silicon dioxide is resistant to fluorine-based etchants, such as $XeF_2$. As described above, the movable layer 170 may be etched with openings or holes 172 so that the etch gas used for sacrificial layer removal can reach the sacrificial material 140.

As shown in FIG. 9D, the sacrificial material 140 is removed between the support structure portions formed by diffusing dopant material into portions of the sacrificial material 140. The sacrificial material 140 is selectively removed, preferably using a selective gas etching process (e.g., selective to the mirror or mechanical layer 170 and dielectric 130), to create the optical cavity 180. After selective etching of the sacrificial material 140, the movable layer 170 is supported by and rests on the support structures 18 formed by selective diffusion of the sacrificial material 140.

In yet another embodiment, instead of selective diffusion, selective implantation of the sacrificial material 140 with ions is followed by laser annealing of the implanted areas to form supports. According to an embodiment, a sacrificial material 140 comprising amorphous silicon is implanted with ions. The selective implantation of ions may be done through the use of a mask. In certain embodiment, these ions may be oxygen, nitrogen, or carbon ions. A laser is used to selectively activate the implanted ions, annealing the implanted areas, thereby forming a support structure. The composition of the support structure will depend on the implanted ions. For example, if the implanted ions are oxygen, the support will comprise $SiO_2$, and if the implanted ions are nitrogen or carbon, the support will comprise $SiN_x$ or $SiC_x$, respectively. Advantageously, because the laser can be highly selective in the area heated, this process avoids the exposure of other components to very high temperatures, which would ordinarily result from oxidation of the support material. In one embodiment, this selective exposure can be done through the use of a mask, which, in further embodiments, is a mask used to control the selective implantation of the sacrificial material 140 with ions. Furthermore, although this embodiment is discussed with respect to the formation of a support structure in an interferometric modulator, it will be understood that the use of this process is not limited to the fabrication of interferometric modulators, but may be applied to different processes in which selective altering is desirable without exposing nearby components to very high temperatures. For example, this process may be used in the fabrication of other types of MEMS devices. It will also be understood that laser annealing can be used on areas of the sacrificial material 140 that have been selectively altered with a dopant material 210 by a process such as, but not limited to, selective diffusion, as described above.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

We claim:

1. A method of making a microelectromechanical systems device, comprising:
   providing a substrate having a first electrode formed over the substrate;
   forming at least one support structure of the device by forming a metal sacrificial material over the first electrode layer and oxidizing some portions of the sacrificial material;
   forming a movable layer over the sacrificial material after forming the at least one support structure; and
   creating a cavity between the substrate and the movable layer.

2. The method of claim 1, wherein creating the cavity comprises selectively removing unoxidized portions of the sacrificial material after forming the movable layer.

3. The method of claim 2, wherein selectively removing comprises etching unoxidized portions of the sacrificial material with an etchant selected from the group consisting of: a source of fluorine, $NH_4OH$, $H_3PO_4$, $Cl_2$ plasma, and PAN (phosphoric acetic nitric) etchant.

4. The method of claim 2, wherein selectively removing comprises etching unoxidized portions of the sacrificial material with $XeF_2$.

5. The method of claim 1, oxidizing comprises masking some portions of the sacrificial material before oxidizing unmasked portions of the sacrificial material.

6. The method of claim 1, wherein oxidizing comprises anodizing some portions of the sacrificial material.

7. The method of claim 6, wherein anodizing comprises masking some portions of the sacrificial material before anodizing unmasked portions of the sacrificial material.

8. The method of claim 1, wherein the metal comprises aluminum.

9. The method of claim 1, wherein the metal is selected from the group consisting of aluminum, magnesium, tantalum, titanium, and molybdenum.

10. The method of claim 1, wherein creating the cavity comprises selectively removing unoxidized portions of the sacrificial material after forming the mechanical layer by plasma etching.

11. The method of claim 1, wherein creating the cavity allows the movable layer to be movable.

12. The method of claim 1, wherein the microelectromechanical systems device is an interferometric modulator.

13. The method of claim 12, wherein the movable layer comprises a mirror layer.

14. The method of claim 1, wherein the microelectromechanical systems device comprises:
   a display;
   a processor that is in electrical communication with said display, said processor being configured to process image data;
   a memory device in electrical communication with said processor.

15. The method of claim 14, wherein the microelectromechanical systems device further comprises:
   a driver circuit configured to send at least one signal to said display.

16. The method of claim 15, wherein the microelectromechanical systems device further comprises:
   a controller configured to send at least a portion of said image data to said driver circuit.

17. The method of claim 14, wherein the microelectromechanical systems device further comprises:
   an image source module configured to send said image data to said processor.

18. The method of claim 15, wherein said image source module comprises at least one of a receiver, transceiver, and transmitter.

19. The method of claim 14, wherein the microelectromechanical systems device further comprises:
   an input device configured to receive input data and to communicate said input data to said processor.

20. An unreleased interferometric modulator device, comprising:
   a substrate;
   a first electrode formed over the substrate;
   a layer formed over the first electrode, wherein the layer comprises a sacrificial portion formed of a metal and a support portion, wherein the support portion is an oxide of the metal; and
   a movable layer over the layer.

21. The unreleased interferometric modulator device of claim 20, wherein the movable layer comprises an electrode.

22. The unreleased interferometric modulator device of claim 20, wherein the movable layer comprises a mirror layer.

23. The unreleased interferometric modulator device of claim 20, wherein the support portion is resistant to an etchant selected from the group consisting of: a source of fluorine, $NH_4OH$, $H_3PO_4$, $Cl_2$ plasma, and PAN (phosphoric acetic nitric) etchant.

24. The unreleased interferometric modulator device of claim 23, wherein the sacrificial portion can be etched by an etchant selected from the group consisting of: a source of fluorine, $NH_4OH$, $H_3PO_4$, $Cl_2$ plasma, and PAN (phosphoric acetic nitric) etchant.

25. The unreleased interferometric modulator device of claim 20, further comprising a second electrode layer, wherein at least a portion of the layer is positioned between the first electrode and the movable layer.

26. The unreleased interferometric modulator device of claim 25, wherein the movable layer comprises a mechanical layer attached to a second electrode layer.

27. A method of making a microelectromechanical systems device, comprising:
   providing a substrate having a first electrode layer formed over the substrate;
   forming at least one support structure by forming a sacrificial material over the first electrode layer and anodizing selected portions of the sacrificial material; and
   creating a cavity between the first electrode layer and a second electrode layer.

28. The method of claim 27, further comprising depositing the sacrificial material over the first electrode layer before forming the second electrode layer over the sacrificial material, wherein creating the cavity comprises selectively removing the sacrificial material in unanodized portions after forming the second electrode layer.

29. The method of claim 27, wherein the sacrificial material comprises a metal selected from the group consisting of aluminum, tantalum, titanium, and molybdenum.

30. The method of claim 27, wherein the sacrificial material comprises molybdenum.

31. The method of claim 27, wherein the sacrificial material comprises silicon.

32. The method of claim 27, wherein creating a cavity comprises etching unanodized portions of the sacrificial material with an etchant selected from the group consisting of: a source of fluorine, $NH_4OH$, $H_3PO_4$, $Cl_2$ plasma, and PAN (phosphoric acetic nitric) etchant.

33. The method of claim 27, wherein creating a cavity comprises etching unanodized portions of the sacrificial material with $XeF_2$.

34. The method of claim 27, wherein creating a cavity comprises masking some portions of the sacrificial material before anodizing the selected portions of the sacrificial material, wherein the selected portions are unmasked portions of the sacrificial material.

35. The method of claim 27, wherein the mocroelectromechanical device is an interferometric modulator.

36. The method of claim 35, wherein the second electrode layer comprises a mirror layer.

37. A method of making an interferometric modulator device, comprising:
    providing a substrate having a first electrode layer formed over the substrate;
    depositing a sacrificial material over the first electrode layer; and
    forming at least one support structure of the device by selectively diffusing a dopant material into the sacrificial material.

38. The method of claim 37, further comprising:
    forming a movable layer over the sacrificial material after forming the at least one support structure; and
    creating a cavity between the substrate and the movable layer.

39. The method of claim 37, wherein the substrate comprises a material selected from the group consisting of sapphire and quartz.

40. The method of claim 37, wherein forming at least one support structure comprises patterning the dopant material over the sacrificial material.

41. The method of claim 40, wherein patterning comprises:
    depositing the dopant material over the sacrificial material; and
    selectively etching the dopant material.

42. The method of claim 40, wherein patterning comprises:
    masking the first electrode layer; and
    depositing the dopant material over the sacrificial material after masking.

43. The method of claim 37, wherein selectively diffusing comprises subjecting the device to a temperature of at least 600° C.

44. The method of claim 37, wherein the sacrificial material comprises silicon and the dopant material comprises a material selected from the group consisting of oxygen, aluminum, zinc, copper, gold, platinum, and sodium.

45. The method of claim 41, wherein the dopant material comprises a material that is resistant to an etchant used for selectively etching.

46. The method of claim 37, wherein the dopant material is a solid.

47. An unreleased interferometric modulator device, comprising:
    a substrate;
    a first electrode formed over the substrate;
    a layer formed over the first electrode, wherein the layer comprises a sacrificial portion formed of a material and a support portion, wherein the support portion comprises the material doped with a dopant material; and
    a movable layer over the layer.

48. The device of claim 47, wherein the substrate comprises a material selected from the group consisting of sapphire and quartz.

49. The device of claim 47, wherein the dopant material is a solid.

50. The device of claim 47, wherein the material of the sacrificial material is selectively etchable with respect to the support portion.

51. A method of making an interferometric modulator device, comprising:
    providing a substrate having a first electrode layer formed over the substrate;
    depositing a sacrificial material over the first electrode layer; and
    forming at least one support structure of the device by selectively implanting ions into the sacrificial material and using a laser to anneal implanted portions of the sacrificial material.

52. The method of claim 51, further comprising forming a patterned mask over the sacrificial material before forming the at least one support structure.

53. The method of claim 51, wherein the ions comprise oxygen ions.

54. The method of claim 51, wherein the ions comprise carbon ions.

55. The method of claim 51, wherein the ions comprise nitrogen ions.

* * * * *

UNITED STATES PATENT AND TRADEMARK OFFICE
CERTIFICATE OF CORRECTION

PATENT NO.        : 7,534,640 B2                                         Page 1 of 1
APPLICATION NO.   : 11/491047
DATED             : May 19, 2009
INVENTOR(S)       : Teruo Sasagawa et al.

It is certified that error appears in the above-identified patent and that said Letters Patent is hereby corrected as shown below:

On the Title Page Item (56) on Page 7, line 31, please change "200510105060.0." to --200510105046.0.--.

In column 9, line 15, please change "comers" to --corners--.

Signed and Sealed this

Seventeenth Day of November, 2009

David J. Kappos
*Director of the United States Patent and Trademark Office*